(12) United States Patent
Nathan et al.

(10) Patent No.: US 11,983,954 B2
(45) Date of Patent: May 14, 2024

(54) PHOTO-CAPACITANCE SENSOR

(71) Applicant: IBMETRIX LIMITED, Hertfordshire (GB)

(72) Inventors: Arokia Nathan, Hertfordshire (GB); William Byrne, Hertfordshire (GB)

(73) Assignee: IBMETRIX LIMITED, Hertfordshire (GB)

( * ) Notice: Subject to any disclaimer, the term of this patent is extended or adjusted under 35 U.S.C. 154(b) by 0 days.

(21) Appl. No.: 18/042,104

(22) PCT Filed: Aug. 18, 2021

(86) PCT No.: PCT/GB2021/052144
§ 371 (c)(1),
(2) Date: Feb. 17, 2023

(87) PCT Pub. No.: WO2022/043661
PCT Pub. Date: Mar. 3, 2022

(65) Prior Publication Data
US 2023/0245491 A1  Aug. 3, 2023

(30) Foreign Application Priority Data

Aug. 18, 2020 (GB) ..................... 2012900

(51) Int. Cl.
*G06V 40/13* (2022.01)
*G06V 40/12* (2022.01)
(Continued)

(52) U.S. Cl.
CPC ...... *G06V 40/1318* (2022.01); *G06V 40/1394* (2022.01); *H01L 27/1446* (2013.01); *H10K 30/60* (2023.02)

(58) Field of Classification Search
CPC .......... G06V 40/1318; G06V 40/1394; G06V 40/1306; G06V 40/145; G06V 40/12;
(Continued)

(56) References Cited

U.S. PATENT DOCUMENTS 4,968,886 A  11/1990  Wan et al.
5,210,049 A   5/1993  Anagnostopoulos
(Continued)

FOREIGN PATENT DOCUMENTS

EP  3070742 A1   9/2016
EP  3739509 A1  11/2020
(Continued)

OTHER PUBLICATIONS

ISA/EP, International Search Report and Written Opinion for PCT Patent Application No. PCT/GB2021/052144, dated May 23, 2022, 29 pages.
(Continued)

*Primary Examiner* — Stephen G Sherman
(74) *Attorney, Agent, or Firm* — NK Patent Law

(57) ABSTRACT

A photo-capacitance sensor includes an input surface and one or more light sources arranged to illuminate a portion of the input surface. The photo-capacitance sensor also includes an array of photo-capacitors arranged to receive light from the one or more light sources which is reflected from an object in contact with, or proximate to, the illuminated portion of the input surface. The array of photo-capacitors is configured for detecting a reflective pattern of the object.

20 Claims, 16 Drawing Sheets

(51) Int. Cl.
*H01L 27/144* (2006.01)
*H10K 30/60* (2023.01)

(58) Field of Classification Search
CPC .... H01L 27/1446; H10K 30/60; H10K 30/65; H10K 59/60; G06F 3/0412; G06F 3/0446; Y02E 10/549
See application file for complete search history.

(56) References Cited

U.S. PATENT DOCUMENTS

| | | |
|---|---|---|
| 2005/0265586 A1 | 12/2005 | Rowe et al. |
| 2011/0096025 A1* | 4/2011 | Slobodin ............... G06F 3/0447 345/174 |
| 2011/0291013 A1 | 12/2011 | Kurokawa et al. |
| 2013/0241887 A1 | 9/2013 | Sharma |
| 2016/0161332 A1* | 6/2016 | Townsend ............ H04N 25/131 359/359 |
| 2018/0088715 A1* | 3/2018 | Lee ..................... G02F 1/13338 |
| 2018/0173923 A1* | 6/2018 | Lee ....................... G06F 3/0443 |
| 2018/0219047 A1 | 8/2018 | Tokuhara et al. |
| 2019/0043420 A1* | 2/2019 | Jung ..................... H10K 59/65 |
| 2019/0294848 A1 | 9/2019 | Zeng et al. |
| 2021/0034189 A1* | 2/2021 | Cheng ................. G06F 3/0416 |

FOREIGN PATENT DOCUMENTS

| | | |
|---|---|---|
| TW | 201001737 A | 1/2010 |
| TW | 201113582 A1 | 4/2011 |

OTHER PUBLICATIONS

Anonymous: "LED-backlit LCD—Wikipedia", Wikipedia—The Free Encyclopedia, Aug. 17, 2020 (Aug. 17, 2020), XP055883311, Retrieved from the Internet: URL:https://en.wikipedia.org/w/index.php?title=LED-backlit_LCD&oldid=973527224, [retrieved on Jan. 25, 2022], pp. 1-2.

Anderson, J. C.: "Theory of photo-capacitance in amorphous silicon MIS structures", Philosophical Magazine B, 46:2, 151-161, 1982, DOI: 10.1080/13642818208246431.

Caputo, D. et al.: "Infrared photodetection at room temperature using photocapacitance in amorphous silicon structures," Appl. Phys. Lett. 72, 1229 (1998); https://doi.org/10.1063/1.121022.

Tucci, M. et al.: "Study of capacitance in hydrogenated amorphous silicon phototransistors for imaging arrays," Journal of Non-Crystalline Solids 338-340 (2004) 780-783, https://doi.org/10.1016/j.jnoncrysol.2004.03.090.

* cited by examiner

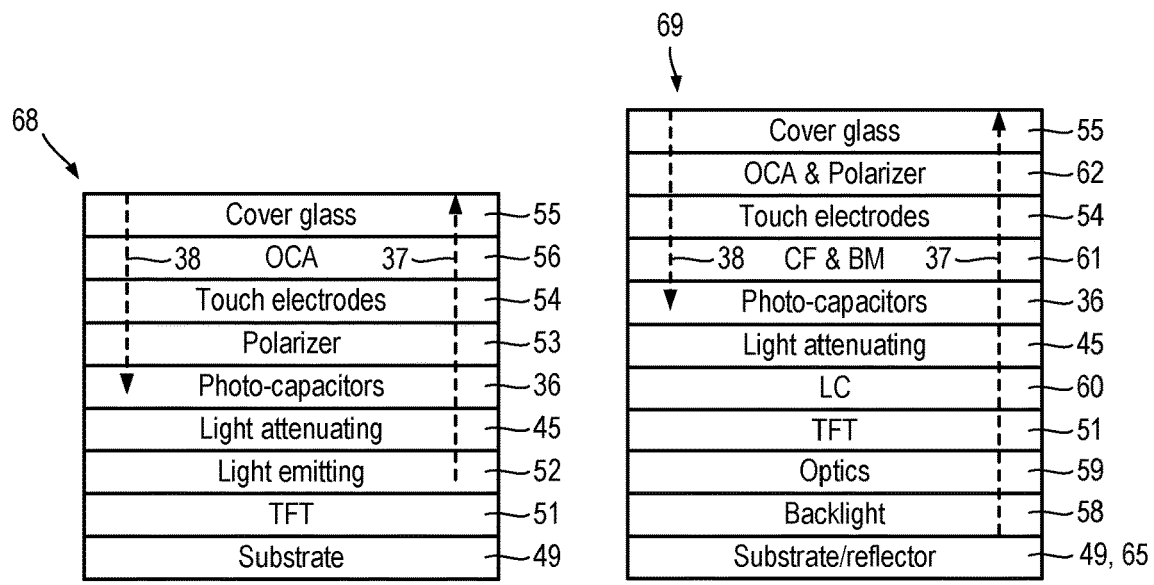
Fig.12  Fig.13
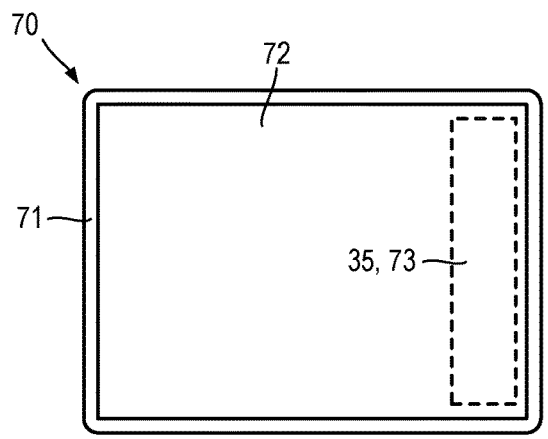
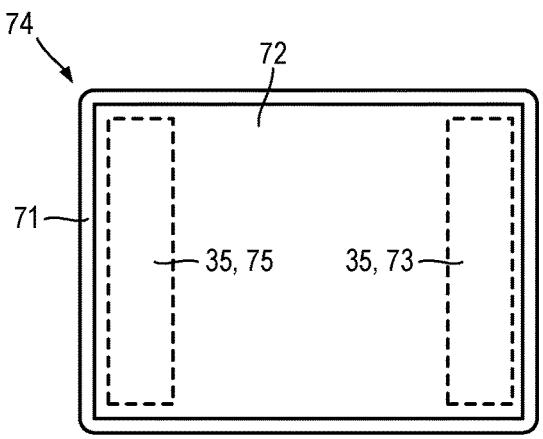
Fig.14  Fig.15
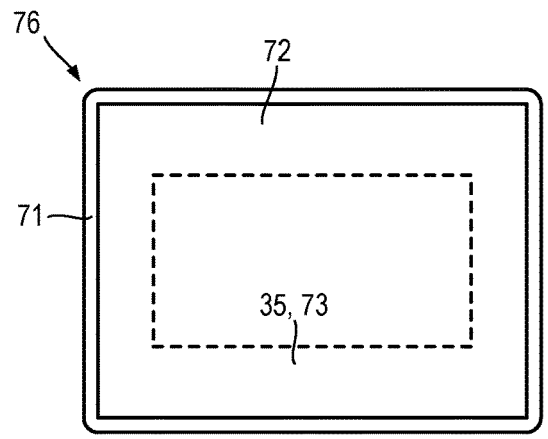
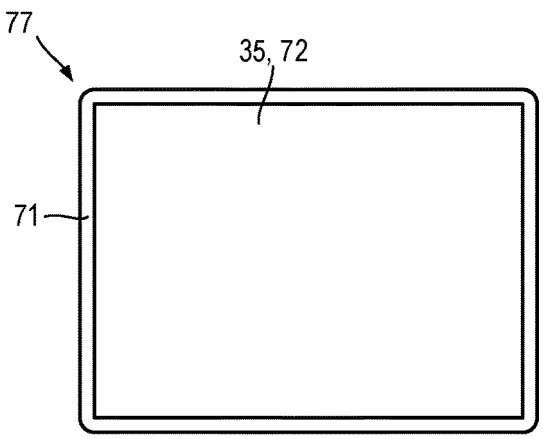
Fig.16  Fig.17

PHOTO-CAPACITANCE SENSOR

CROSS REFERENCE TO RELATED APPLICATIONS

This application is a U.S. National Stage Application of International Patent Application No. PCT/GB2021/052144 filed on Aug. 18, 2021, which claims priority to United Kingdom Patent Application No. 2012900.3 filed on Aug. 18, 2020, the entire content of all of which is incorporated by reference herein.

FIELD OF THE INVENTION

The present invention relates to photo-capacitance sensors, in particular photo-capacitance sensors for detecting patterns in reflected light. The photo-capacitance sensors may be used for biometric authentication such as sensing fingerprints or other distinctive patterns. The photo-capacitance sensors may be incorporated into touchscreen display panels.

BACKGROUND

The photo-capacitive effect relates to a change in the spatial charge distribution of a material in response to illumination with light within a range of wavelengths. If that material is incorporated between the electrodes of a capacitor, the presence and/or intensity of illumination may be determined based on measuring a change in the capacitance of the capacitor.

J. C. Anderson (1982), "Theory of photo-capacitance in amorphous silicon MIS structures", Philosophical Magazine B, 46:2, 151-161, 1982, DOI: 10.1080/13642818208246431, describes a theoretical treatment of the photo-capacitance effect in a silicon metal-insulator-semiconductor (MIS) structure.

D. Caputo, G. de Cesare, A. Nascetti, F. Palma, and M. Petri, "Infrared photodetection at room temperature using photocapacitance in amorphous silicon structures," Appl. Phys. Lett. 72, 1229 (1998); https://doi.org/10.1063/1.121022, describes a device, based on amorphous silicon material, able to detect infrared light through capacitance measurement at room temperature.

M. Tucci, D. Caputo, "Study of capacitance in hydrogenated amorphous silicon phototransistors for imaging arrays," Journal of Non-Crystalline Solids 338-340 (2004) 780-783, https://doi.org/10.1016/j.jnoncrysol.2004.03.090, describes a study of capacitance in hydrogenated amorphous silicon phototransistors in order to determine their applicability in large area imaging systems.

SUMMARY

According to a first aspect of the invention there is provided a photo-capacitance sensor including an input surface and one or more light sources arranged to illuminate a portion of the input surface. The photo-capacitance sensor also includes an array of photo-capacitors arranged to receive light from the one or more light sources which is reflected from an object in contact with, or proximate to, the illuminated portion of the input surface. The array of photo-capacitors is configured for detecting a reflective pattern of the object.

The reflective pattern may correspond to an albedo pattern, a colour pattern and/or a relief pattern. The reflective pattern may correspond to a fingerprint and/or another pattern of skin ridges.

The array of photo-capacitors may be configured for detecting a fingerprint.

A pitch/spacing between photo-capacitors within the array may be less than 1 mm. A pitch/spacing between photo-capacitors within the array may be less than 0.5 mm. A pitch/spacing between photo-capacitors within the array may be small enough to resolve fingerprint ridges. The array of photo-capacitors may be configured for detecting a pattern of human skin ridges.

Each photo-capacitor may include, or be formed from, a disordered, crystalline or polycrystalline material. Each photo-capacitor may include, or be formed from, a material including trap states in a bandgap of the material which are able to absorb sub-gap photon energies. Each photo-capacitor may include, or be formed from, one or more of amorphous silicon, amorphous semiconducting oxides, organic materials, and so forth.

The term "proximate" may refer to the object being sufficiently close to the input surface that the reflective pattern is resolvable given the pitch/spacing of photo-capacitors within the array. The maximum distance may depend, amongst other factors, on the dispersion of light supplied by the light sources and the spatial frequency of the reflective pattern. For example, to read a fingerprint, a photograph, a document and so forth, proximate may refer to less than or equal to 1 mm for collimated or laser light sources, and less than or equal to 0.1 mm for non-collimated light sources. For detecting a shape of a fingertip or hand, the distance may be larger, for example less than or equal to 100 mm for collimated or laser light sources, or less than or equal to 10 mm for non-collimated light sources. In challenging applications such as resolving under-skin tissues, for example veins, proximate may refer to less than or equal to 0.5 mm for collimated or laser light sources.

The photo-capacitance sensor may be implemented as part of a passive sensor and/or a passive sensing layer. The photo-capacitance sensor may be implemented as part of an active sensor and/or an active sensing layer. The photo-capacitance sensor may be implemented as part of a button, a touch pad, a touch panel, a touch screen display, and so forth.

The photo-capacitance sensor may be operable when the input surface is wetted by, and/or submerged in, water or any other fluid transparent at wavelengths emitted by the light source(s) and to which the photo-capacitor(s) are sensitive.

The one or more light sources may be directional and may emit light towards the input surface. The one or more light sources may be disposed between the array of photo-capacitors and the input surface.

The array of photo-capacitors may be disposed between the one or more light sources and the input surface. The photo-capacitance sensor may also include a light attenuating layer disposed between the one or more light sources and the array of photo-capacitors. The light attenuating layer may be configured to screen the photo-capacitors from direct illumination by the one or more light sources within a wavelength range to which the photo-capacitors are sensitive.

The light attenuating layer may be patterned. The light attenuating layer may be opaque and may substantially or completely block light. The light attenuating layer may be selectively light blocking, and may take the form of a filter configured to block light within the wavelength range. The light attenuating layer may take the form of a polarizer.

The one or more light sources may include one or more infrared emitters. Infrared emitters may include, or take the form of, light emitting diodes. An infrared emitter may correspond to a peak emission in the range between (and inclusive of) 800 nm and 2,500 nm.

The one or more light sources may include one or more emitters selected from red, green and blue emitters. Red emitters may include, or take the form of, light emitting diodes. A red emitter may correspond to a peak emission in the range between (and inclusive of) 700 nm and 635 nm.

The array of photo-capacitors may include a number of first electrodes extending in a first direction and spaced apart in a second, different direction. The array of photo-capacitors may include a number of second electrodes extending in the second direction and spaced apart in the first direction. The array of photo-capacitors may include a layer of photo-capacitive material disposed between the first and second electrodes such that each intersection of the first and second electrodes provides a photo-capacitor of the array.

The array of photo-capacitors may include a number of first electrodes extending in a first direction and spaced apart in a second, different direction. The array of photo-capacitors may include a plurality of second electrodes extending in the second direction and spaced apart in the first direction. The plurality of first electrodes and the plurality of second electrodes may be substantially co-planar, and may be disposed on or over a layer of photo-capacitive material, such that each intersection of the first and second electrodes provides a photo-capacitor of the array.

The array of photo-capacitors may include, in order, a number of first electrodes extending in a first direction and spaced apart in a second, different direction, a dielectric layer, a number of second electrodes extending in the second direction and spaced apart in the first direction, and a layer of photo-capacitive material. The array of photo-capacitors may include, in order, a layer of photo-capacitive material, a number of first electrodes extending in a first direction and spaced apart in a second, different direction, a dielectric layer and a number of second electrodes extending in the second direction and spaced apart in the first direction.

The array of photo-capacitors may include a number of first electrodes extending in a first direction and spaced apart in a second, different direction. The array of photo-capacitors may include a plurality of second electrodes extending in the second direction and spaced apart in the first direction. The plurality of first electrodes and the plurality of second electrodes may be substantially co-planar, and a layer of photo-capacitive materials may be substantially co-planar with the first and second electrodes, and disposed in the gaps separating the first and second electrodes.

The photo-capacitance sensor may also include one or more conductive traces for projected capacitance measurements.

A display screen may include a cover lens and a display stack-up. The display stack may include the photo-capacitance sensor according to the first aspect. The cover lens may provide the input surface.

The display stack-up may include a backlight layer. The backlight layer may provide the one or more light sources, or the backlight layer may include the one or more light sources. The backlight layer may include the one or more light sources and one or more additional light emitters. The backlight layer may consist of the one or more light sources.

The display stack-up may include a pixel layer in the form of an array of light-emitting diodes. The array of light-emitting diodes may provide the one or more light sources, or the array of light-emitting diodes may include the one or more light sources. The pixel layer may include the one or more light sources and one or more additional light emitters. The pixel layer may consist of the one or more light sources.

The display stack-up may include a thin-film transistor layer. The thin-film transistor layer may provide the array of photo-capacitors, or the thin-film transistor layer include the array of photo-capacitors. The photo-capacitance sensor may be implemented as part of the thin-film transistor layer. The photo-capacitance sensor may take the form of a thin-film transistor having the source and drain shorted, to form a capacitor between the gate and the connected source and drain.

The display stack-up may include a thin-film transistor layer and a separate photo-capacitor layer. The separate photo-capacitor layer may provide and/or define the array of photo-capacitors.

The display stack-up may have a display area. The (illuminated) portion of the input surface may correspond to a first region of the display area.

The display screen may also include a second photo-capacitance sensor according to the first aspect. The second photo-capacitance sensor may be associated with a portion of the input surface corresponding to a second region of the display area which is different to the first region.

The display stack-up has a display area, and the (illuminated) portion of the input surface may substantially correspond to the display area. The illuminated) portion of the input surface may substantially correspond to the display area if it corresponds to 90% or more of the display area.

The display stack-up may include conductive traces for projected capacitance touch sensing.

An access control device may include the photo-capacitance sensor or the display screen according.

An access control device may be used for activation of equipment such as, for example, a printer, a medical device, a door, an elevator (lift) control panel, a motor vehicle, a motorcycle, a cycle, building plant such as; bulldozers, backhoes, excavators, and aircraft, military equipment. An access control device may be used for activation of equipment such as, for example, Drug cabinets, hospital wards such as maternity and natal units, hotel guest room doors, hotel back of house doors, or any other room or space to which it is desired to control access.

Apparatus may include the photo-capacitance sensor, the display screen, and/or the access control device described hereinbefore. The apparatus may also include a controller connected to the photo-capacitance sensor and configured to measure capacitances of the array of photo-capacitors.

The controller may be further configured to measure photo-capacitive components of the capacitances of the array of photo-capacitors.

The controller may be configured such that measuring photo-capacitive components includes measuring capacitances for at least a subset of the array of photo-capacitors.

Measuring photo-capacitive components may also include determining an interaction region based on the capacitances of the subset of the array of photo-capacitors.

Measuring photo-capacitive components may also include de-activating each light source corresponding to the interaction region, measuring projected capacitance components for each photo-capacitor corresponding to the inter-action region. Measuring photo-capacitive components may also include activating at least a subset of light sources corresponding to the interaction region. Measuring photo-capacitive components may also include measuring total capacitances for each photo-capacitor corresponding to the interaction region. Measuring photo-capacitive components may also include determining photo-capacitive components corresponding to the interaction region based on differences of total capacitances and the respective projected capacitance components.

The subset of the array of photo-capacitors may include all of the photo-capacitors. The subset of light sources may include all of the light sources. The subset of light sources may include all light sources of a specific colour. For example, a display may include red (R), green (G) and blue (B) pixels, and all may be de-activated to measure the projected capacitance components, followed by activating only the red (R) light sources for measurement of the total capacitances. In other examples, a display may also include IR light sources over at least a portion of the display surface, and only the IR light sources may be re-activated for the purposes of determining the photo-capacitive components.

The process of de-activating and activating light sources may be repeated any number of times in order to refine the photo-capacitive components, for example by averaging. When the light sources includes two or more colours, the process of de-activating and activating light sources may be repeated one or more times, activating only a single colour of light source for each measurement of total capacitance. In this way, photo-capacitance components may be independently obtained for each different colour of light source available.

The array of photo-capacitors may take the form of the intersections between the plurality of first electrodes and the plurality of second electrodes as described hereinbefore. In such a case, the controller may drive the first electrodes using transmitter outputs and monitor the second electrodes using receiver inputs. Each transmitter output may provide a driving signal having a different frequency. The controller may have a number of transmitter outputs which is less than a number of first electrodes, and each transmitter output may be connected to two or more first electrodes via a respective multiplexer. The outputs from a multiplexer may be connected to a subset of first electrodes which are spatially grouped in the photo-capacitance sensor. In other words, each transmitter output may be multiplexed to first electrodes corresponding to a particular stripe or strip of the photo-capacitance sensor corresponding to the subset of first electrodes. Alternatively, the outputs from two or more multiplexers may be interleaved such that within one or more spatially grouped subsets of first electrodes, each first electrode is connectable to a different transmitter output via a respective multiplexor. This latter option may permit all first electrodes within a particular stripe or strip of the photo-capacitance sensor corresponding to the subset of first electrodes to be driven for measurement simultaneously.

The controller may have a number of receiver inputs which is less than a number of second electrodes, and the receiver inputs may be multiplexed to the second electrodes in anyway described in relation to the transmitter outputs and first electrodes.

Apparatus may include the display screen, wherein the display stack-up includes conductive traces for projected capacitance touch sensing, and a controller connected via a switch network to the conductive traces for projected capacitance touch sensing and the photo-capacitance sensor. The controller may be configured to time multiplex, using the switch network, measurements of projected capacitances from the conductive traces and measurements of photo-capacitances from the photo-capacitance sensor.

Apparatus may include the display screen, wherein the display stack-up includes conductive traces for projected capacitance touch sensing, a controller connected to the photo-capacitance sensor and configured to measure photo-capacitances of the array of photo-capacitors, and a dedicated touch controller connected to the conductive traces and configured for projected capacitance touch sensing using the conductive traces.

The apparatus may be configured, in response to detecting a user interaction using projected capacitance measurements, to determine whether the user interaction corresponds to all or part of a user hand in contact with the input surface. The apparatus may be configured, in response to determining that the user interaction corresponds to all or part of a user hand, to determine one or more finger-print regions. The apparatus may be configured, in response to determining one or more finger-print regions, to measure photo-capacitances corresponding to each finger-print region.

The controller may store a reference frame corresponding to the measured capacitances of the array of photo-capacitors when the one or more light sources are illuminated in the absence of the object above or in contact with the input surface. The controller may be further configured to subtract the reference frame from the capacitances measured from the array of photo-capacitances.

The controller may be further configured to control light emission from the one or more light sources. Alternatively, the second controller may be configured to control light emission from the one or more light sources.

The apparatus may be further configured such that, in response to detecting a touch using projected capacitance, the controller measures capacitances of the array of photo-capacitors.

The apparatus may also be configured such that in response to detecting a touch using projected capacitance, the controller or second controller illuminates the one or more light sources, and the controller measures capacitances of the array of photo-capacitors.

The one or more light sources may include one or more infrared light sources and one or more red light sources. The controller or the second controller may be configured to illuminate the infrared light sources and measure a first set of capacitances from the array of photo-capacitors. The controller or the second controller also may be configured to illuminate the red light sources and measure a second set of capacitances from the array of photo-capacitors. The controller may be configured to compare the first and second sets of capacitances to determine whether an object above or in contact with the input surface corresponds to human skin.

The controller may be configured to determine whether an object above or in contact with the input surface corresponds to human skin by detecting whether the difference between reflections of infrared and red light is consistent with oxygenated human tissue. In this way, spoofing of the sensor using a facsimile of a fingerprint may be detected and prevented.

The controller may be further configured to control the one or more infrared light sources and the photo-capacitance sensor to detect and/or image one or more veins comprised in the object.

The apparatus may be configured to compare a pattern of capacitances measured using the array against a set of one or more authorised patterns. The apparatus may also be configured, in response to the pattern of capacitances measured using the array matches an authorised pattern of the one or more authorised patterns, to output a signal.

Comparison of the pattern of capacitances against the set of one or more authorised patterns may be conditional upon the measured pattern of capacitances corresponding to an interaction area exceeding a minimum area. The size of the interaction area may be determined based on photo-capacitance measurements obtained from the photo-capacitance sensor and/or projected capacitance measurements obtained from the photo-capacitance sensor and/or the conductive traces.

This condition may ensure that comparisons are based on a minimum area, which may help to reduce false matches and improve security. When the apparatus includes a display and the interaction area is insufficient for a comparison, the display may be controlled to display a message informing a user to re-position their digit (or palm etc) to allow a more complete measurement.

The signal may activate equipment such as, for example, a printer, a medical device, a door, an elevator control panel, a motor vehicle, a motorcycle, a cycle, building plant such as; bulldozers, backhoes, excavators, and aircraft, military equipment. The signal may activate equipment such as, for example, Drug cabinets, hospital wards such as maternity and natal units, hotel guest room doors, hotel back of house doors, or any other room or space to which it is desired to control access.

According to a second aspect of the invention, there is provided a method of using the photo-capacitance sensor, the display screen, the access control device and/or the apparatus, the method including measuring capacitances of the array of photo-capacitors.

The method may include features corresponding to any features of the photo-capacitance sensor, the display screen, the access control device and/or the apparatus.

The method may also include retrieving or obtaining a reference frame corresponding to the measured capacitances of the array of photo-capacitors when the one or more light sources are illuminated in the absence of the object above or in contact with the input surface. The method may also include subtracting the reference frame from the capacitances measured using the array of photo-capacitances.

The method may also include comparing a pattern of capacitances measured using the array against a set of one or more authorised patterns. The method may also include in response to the pattern of capacitances measured using the array matches an authorised pattern of the one or more authorised patterns, outputting a signal.

According to a third aspect of the invention, there is provided a photo-capacitance sensor including an input surface, and an array of photo-capacitors arranged to receive light from a light source which is transmitted through the input surface. The array of photo-capacitors is configured for detecting a laser point spot.

The configuration of the array of photo-capacitors is configured for detecting a laser point spot may correspond to a spacing with the array of between (and including) 1 mm and 5 mm.

The photo-capacitance sensor of the third aspect may include features correspond to any features of the photo-capacitance sensor, display screen and/or apparatus according to the first aspect, and/or the method according to the second aspect.

According to a fourth aspect of the invention, there is provided a system including an input surface. The system also includes one or more light sources arranged to illuminate a portion of the input surface. The system also includes an array of photo-capacitors arranged to receive light from the one or more light sources which is reflected from an object in contact with, or proximate to, the illuminated portion of the input surface. The system also includes a controller configured to detect one or more touches based on projected capacitance scanning using the array of photo-capacitors. The controller is also configured to obtain a fingerprint pattern corresponding to at least one of the one or more touches based on photo-capacitance measurements obtained using the array of photo-capacitors.

The system of the fourth aspect may include features correspond to any features of the photo-capacitance sensor, display screen and/or apparatus according to the first aspect, and/or the method according to the second aspect.

The system may also include a display, and the system may be a touchscreen system.

The one or more light sources may include, or take the form of, one or more infrared light sources. The controller may be configured to pulse at least one of the infrared light sources during measurement of a corresponding photo-capacitance. Infrared light sources may be near-infrared light sources. The term "strobe" may be used as an alternative to the term "pulse".

BRIEF DESCRIPTION OF THE DRAWINGS

Certain embodiments of the present invention will now be described, by way of example, with reference to the accompanying drawings in which:

FIG. 12 is a schematic cross section of a third on-cell stack-up;

FIG. 13 is a schematic cross section of a fourth on-cell stack-up;

FIG. 14 is a schematic plan view of a first display layout;

FIG. 15 is a schematic plan view of a second display layout;

FIG. 16 is a schematic plan view of a third display layout;

FIG. 17 is a schematic plan view of a fourth display layout;

DETAILED DESCRIPTION OF CERTAIN EMBODIMENTS

Figure 1:
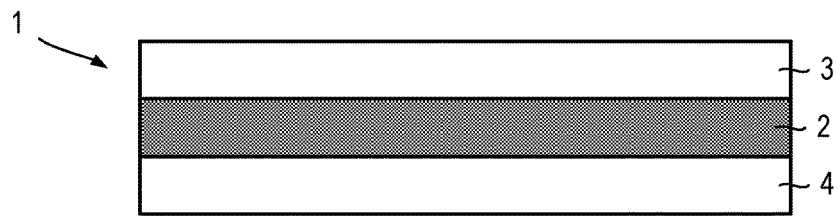
FIG. 1 schematically illustrates a photo-capacitor.

In the following, like parts are denoted by like reference numbers.

The use of biometric authorisation is increasing for a variety of purposes such as providing quick access to smart phones, tablets and other devices. Biometric authorisation may also be used within software applications, for example to authorise financial transactions. Other applications of biometric authorisation are described hereinafter.

One existing technology is based on visible light reflection from, for example, a finger of a user, and subsequent detection of a fingerprint using a photodetector array. Fingerprint sensors are often provided in or under buttons which are separate from a display. It would be desirable to locate a fingerprint sensor within the same area as a display, for example in order to allow use of fingerprint biometrics without sacrificing display area.

The present specification is concerned with photo-capacitance sensors which may be used, amongst other application described hereinafter, to provide an integrated in-display fingerprint reader for in user/application authorisation and so forth. In contrast to prior art approaches based on photodetectors (e.g. photo-diodes), the present specification proposes to use arrays of photo-capacitors which may detect light reflected from a pattern (e.g. a fingerprint) placed close to, or in contact with, an input surface (e.g. a phone screen). The use of photo-capacitors may enable greater flexibility for placement of a pattern sensor within a display. For instance, some examples may employ infrared red (IR) reflection off a finger, which is subsequently detected by a photo-capacitor array. This may be advantageous in view of the limited or reduced IR absorption of most materials used in a display module, enabling placement of the photo-capacitor array at a variety of heights within a display stack-up.

The spatial resolution of photo-capacitance sensors according to this specification may be tuned depending on the type of reflectance pattern which is intended to be read. For example, for detecting fingerprints using an integrated in display array, the photo-capacitors may be located at every (R-G-B) pixel or at every R, G, B sub-pixel. For high resolution displays, every $n^{th}$ pixel (with n a positive integer) may be sufficient, since the spatial scale of patterns intended to be read dictates the required resolution.

Photo-capacitance sensors according to the present specification may be used in combination with capacitive touch sensing (or even integrated with capacitive touch sensing). A factor which may add to the flexibility in terms of photo-capacitor location is the non-concurrent readout of capacitive touch and photo-capacitance as these are two different modes of interaction.

Amongst other devices, photo-capacitive sensors according to the present specification could be embedded in current display architectures such as so called "in-cell", "on-cell", "hybrid in-cell" solutions, and/or future variants thereof which use an embedded touch solution.

Photo-Capacitance

Referring to FIG. 1, a photo-capacitor 1 is shown.

The photo-capacitor 1 includes a photo-capacitive material layer 2 between a first electrode 3 and a second electrode 4. A photo-capacitive material 2 is a material which exhibits a photo-capacitance effect. Without wishing to be bound by theory, a short explanation of the photo-capacitance effect may aid understanding of the present specification.

Photo-capacitance represents a change in the charge state of a material 2 upon exposure to light. This change in charge state differs from the so-called geometric capacitance, which is intrinsic to the material and can be considered as a dark capacitance.

Photo-capacitance may be observed in disordered materials in which carrier trapping is dominant. Unlike crystalline (or ordered materials) where transitions take place from the valence to the conduction bands in the presence of illumination (thereby producing a photocurrent which may be harnessed), in a disordered material the illumination (dependent on wavelength/energy) may induce transitions of electrons from valence band states to localized trap states. These electrons remain trapped and at some point return to the valence band. During this period there is no photocurrent due to the immobility of carriers in the trapped states, but there is a change in capacitance, which can be utilized as a means of detecting the illumination.

The wavelength or energy of the incident radiation plays an important role in the transition kinetics of the electrons that give rise to photo-capacitance. A disordered material may have localized and deep defect states distributed within its bandgap energy. For example, a-Si:H has a bandgap of 1.7 eV whilst amorphous oxide semiconductor (AOS) can be in excess of 3 eV. When photons of energy less than the bandgap energy are incident on the disordered semiconductor, electrons or holes from the extended (valence band or conduction band) states can be excited to fill the deep defect states or tail states—this defines the process of charge trapping which alters the charge state of the material as well as its internal electric field distribution. As mentioned hereinbefore, these trapped charges do not contribute to a photocurrent because they are immobilised, but contribute instead to a photo-capacitance which may be expressed as:

$$\frac{\partial Q_{total}}{\partial V} = \frac{\partial Q_{trap}}{dV} + \frac{\partial Q_{conductive}}{dV} \quad (1)$$

In which V is the potential applied between the electrodes of a photo-capacitor, for example photo-capacitor 1, $Q_{total}$ is total charge, $Q_{trap}$ is the charge associated with trap states, and $Q_{conductive}$ is the charge on the electrodes, for example first and second electrodes 3, 4. Consequently, a total capacitance $C_{total}$ may be considered to be a sum of a photo-capacitance $C_{photo}$ due to trap states and a dark (or geometric) capacitance $C_{dark}$ resulting from the spatial separation and shapes of the electrodes:

$$C_{total} = C_{photo} + C_{dark} \quad (2)$$

The additional capacitance $C_{photo}$ can be measured in a variety of ways such as, for example, device configurations in the form of a passive capacitor (photo-capacitor 1), a transistor, a diode, or any other suitable circuit, for example adapted from those deployed in the touch panel industry. Examples of implementation architectures are discussed hereinafter.

In terms of frequency response, the useful signal (i.e. $C_{photo}$) may be acquired at low frequencies, for example several hundred Hz, which remains well above the frequency ranges in which noise induced by static discharge, power supply noise or any other forms of low frequency noise may reside. As frequency is increased, for example above several kHz, it is possible that the additional capacitance $C_{photo}$ may become difficult to measure, or vanish entirely, due to a vanishing trap emission process.

—Materials Considerations—

There are a number of disordered materials used in the flat panel industry which could be considered for use as the photo-capacitive layer 2 of a photo-capacitance sensor. Suitable materials do not include indium tin oxide, which is used as a passive transparent conductor.

Disordered materials are often used as active layers in thin film transistors (TFTs), for example hydrogenated amorphous silicon (a-Si:H) (which we use as an example herein), followed by a wide selection of organic semiconductors, and more recently, amorphous semiconducting oxides, for example indium-gallium-zinc-oxide (IGZO).

For example, a-Si:H is widely used in solar cells, photodiodes for visible light detection, and has been the conventional material used in the thin film transistor (TFT) switch that forms the basis of the active matrix liquid crystal display (LCD), or active matrix organic light emitting diode (AMOLED) display. In particular, the a-Si:H material is heavily disordered leading to a large concentration of distributed trap states, in fact typically three to four orders of magnitude higher than the amorphous oxide semiconductor (AOS) counterpart. However, a-Si:H is a lower bandgap material and a good absorber of visible light radiation (absorption primarily peaking in the green) as well as in near infrared which constitute lower energies. In contrast, the AOS counterparts are high bandgap materials and generally transparent to visible light (absorption peaking in deep blue and UV) but do show absorption in near infrared, albeit somewhat weak but sufficient for a photo-capacitance response.

In contrast to the operating principle in photodetectors (e.g. photo-diodes) and phototransistors, which relies on generation of a photocurrent when a material is illuminated with visible light, a materials response to lower energy (longer wavelength) radiation is not due to photocurrent but photo-capacitance, instead of trapping a charge, (charge trapping) the disordered nature gives rise to trap states providing sufficient absorption of even low energy radiation. The charge trap-release process can be receptive to frequencies of stimulating signal used to measure capacitance, for example up to several kHz.

—Electrodes of Photo-Capacitors—

The first and second electrodes 3, 4 used to form a photo-capacitor 1 are not particularly limited, subject to permitting at least some incident light to reach the photo-capacitive layer 2.

For example, referring also to FIGS. 2A through 2I, a range of possible electrode types are shown.

Figure 2A:
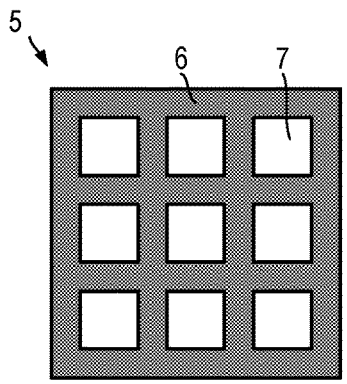
FIG. 2A is a schematic plan view of a mesh electrode.

Referring in particular FIG. 2A, a mesh electrode 5 is shown.

Figure 2B:
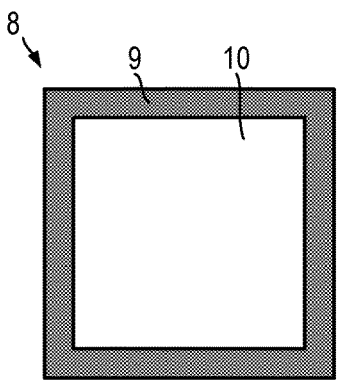
FIG. 2B is a schematic plan view of a frame electrode.

The mesh electrode 5 takes the form of a conductive grid 6 formed of, for example, horizontal and vertical lines, leaving an array of gaps 7 through which light may pass to the photo-capacitive layer 2. The conductive grid 6 may be formed from metal, or any other conductive material which may be processed to form the grid 6. Either or both of the first and second electrodes 3, 4 may take the form of mesh electrodes 5. Referring in particular to FIG. 2B, a frame electrode 8 is shown.

The frame electrode 8 takes the form of a conductive strip 9 which runs around the perimeter of a photo-capacitor 1, leaving an opening 10 through which light may pass to the photo-capacitive layer 2. The conductive strip 9 may be formed from metal, or any other conductive material which may be processed to form the strip 9. Either or both of the first and second electrodes 3, 4 may take the form of frame electrodes 8.

Figure 2C:
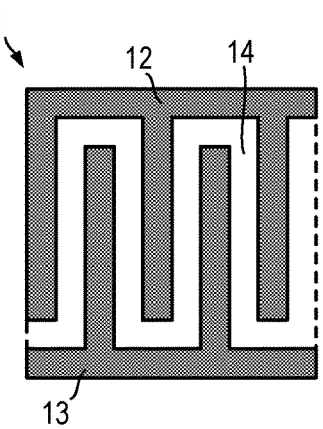
FIG. 2C is a schematic plan view of an interdigitated electrode.

Referring in particular to FIG. 2C, an interdigitated electrode 11 is shown.

The interdigitated electrode 11 takes the form of a first conductor 12 having elongate regions which are interdigitated with elongate regions of a second conductor 13 to leave a serpentine gap 14. The conductors 12, 13 may be formed from metal, or any other conductive material which may be processed to form the conductors 12, 13. The first and second conductors 12, 13 may be connected to one another to form a first electrode 3 or a second electrode 4.

Alternatively, the first conductor 12 may provide the first electrode 3, the second conductor 13 may provide the second electrode 4 and the photo-capacitive material 2 may fill the serpentine gap 14 to form a photo-capacitor having a planar structure instead of the layered structure of photo-capacitor 1.

Figure 2D:
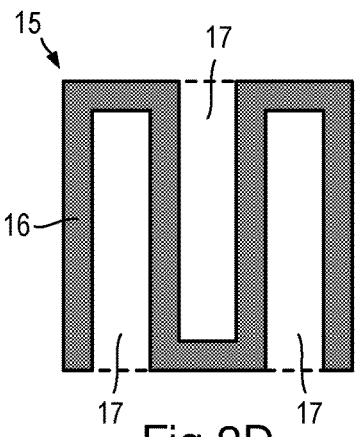
FIG. 2D is a schematic plan view of a serpentine electrode.

Referring in particular to FIG. 2D, a serpentine electrode 15 is shown.

The serpentine electrode 15 takes the form of a conductive track 16 which follows a serpentine path leaving openings 17 between parallel sections of the conductive track 16, through which light may pass to the photo-capacitive layer 2. The conductive track 16 may be formed from metal, or any other conductive material which may be processed to form the conductive track 16. Either or both of the first and second electrodes 3, 4 may take the form of serpentine electrodes 15.

Figure 2E:
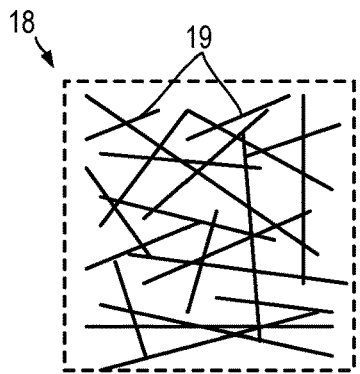
FIG. 2E is a schematic plan view of a nanowire mat electrode.

Referring in particular to FIG. 2E, a nanowire mat electrode 18 is shown.

The nanowire mat electrode 18 takes the form of a mat of conductive nanowires 19 which is dense enough to provide conduction across the nanowire mat electrode 18 without being dense and/or thick enough to block light from reaching the photo-capacitive layer 2. The conductive nanowires 19 may be metal nanowires, carbon nanotubes (single- or multi-wall), or any other suitable conductive nanowires. Either or both of the first and second electrodes 3, 4 may take the form of nanowire mat electrodes 18.

Figure 2F:
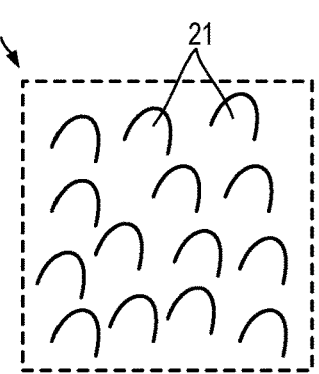
FIG. 2F is a schematic plan view of a pillar structured electrode.

Referring in particular to FIG. 2F, a pillar structured electrode 20 is shown.

The pillar structured electrode 20 takes the form of a transparent conductive material which is patterned into a regular or irregular array of rods/columns/pillars 21. Any transparent conductive material may be used, for example, indium tin oxide (ITO). Either or both of the first and second electrodes 3, 4 may take the form of pillar structured electrodes 20. The capacitance may be increased if the pillars 21 of the first and second electrodes 3, 4 extend towards each other so as to be interpenetrating.

Figure 2G:
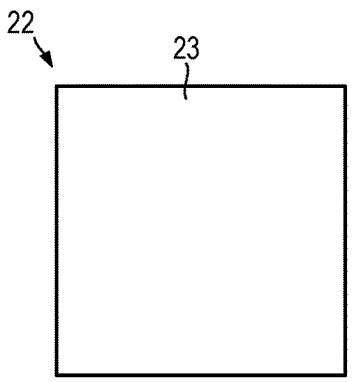
FIG. 2G is a schematic plan view of a transparent electrode.

Referring in particular to FIG. 2G, a transparent electrode 22 is shown.

The transparent electrode 22 takes the form of a continuous region 23 of a transparent conductive material, for example ITO. Either or both of the first and second electrodes 3, 4 may take the form of transparent electrodes 22.

Figure 2H:
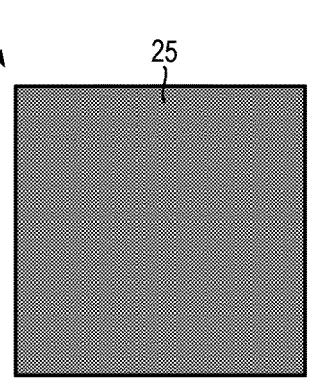
FIG. 2H is a schematic plan view of an opaque electrode.

Referring in particular to FIG. 2H, an opaque electrode 24 is shown.

The opaque electrode 24 takes the form of a continuous region 25 of an opaque conductive material, for example a metal layer. In some examples whichever of the first and second electrodes 3, 4 is further from the pattern being measured may take the 35 form of the opaque electrode, whilst the other electrode of the pair takes the form of an electrode which permits light to reach the photo-capacitive material 2. Alternatively, the opaque electrode 24 may be very thin such that some light is transmitted through to the photo-capacitive material 2.

Figure 2I:
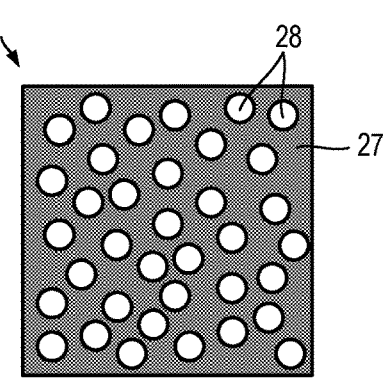
FIG. 2I is a schematic plan view of a porous electrode.

Referring in particular to FIG. 2I, a porous electrode 26 is shown.

The porous electrode 26 takes the form of a porous conductive layer 27 which includes an area fraction of voids 28 through which light may pass to the photo-capacitive layer 2. The porous conductive layer 27 may be formed from metal, or any other conductive material which may be processed to form the porous conductive layer 27. Either or both of the first and second electrodes 3, 4 may take the form of porous electrodes 26.

Photo-Capacitance Sensor

Figure 3:
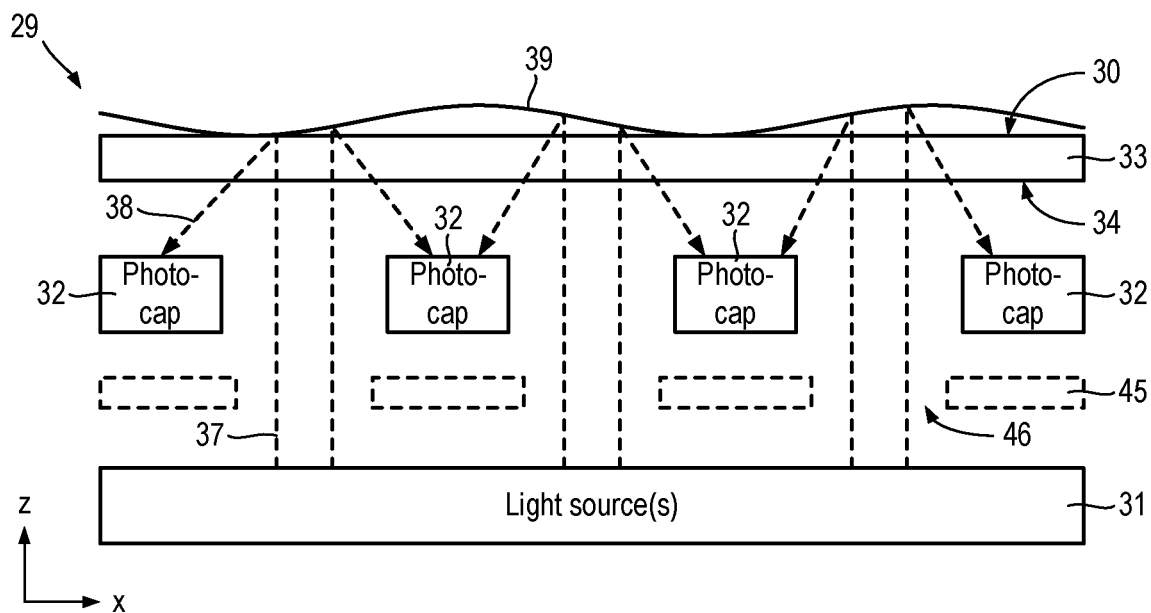
FIG. 3 schematically illustrates a first photo-capacitance sensor.

Referring also to FIG. 3, a photo-capacitance sensor 29 is shown.

The photo-capacitance sensor 29 includes an input surface 30, one or more light sources 31 and an array 36 (FIG. 4) of photo-capacitors 32. The input surface 30 is provided by a transparent layer 33 formed from, for example, glass or transparent plastics such as Polyethylene terephthalate (PET) or polycarbonate (PC). The input surface 30 is a face of the transparent layer 33 facing away from the light source(s) 31, and the transparent layer 33 has a second face 34 facing towards the light source(s) 31. The one or more light sources 31 are arranged to illuminate a portion 35 (FIG. 14) of the input surface 33 (i.e. through the transparent layer 33) with emitted light 37.

Figure 4:
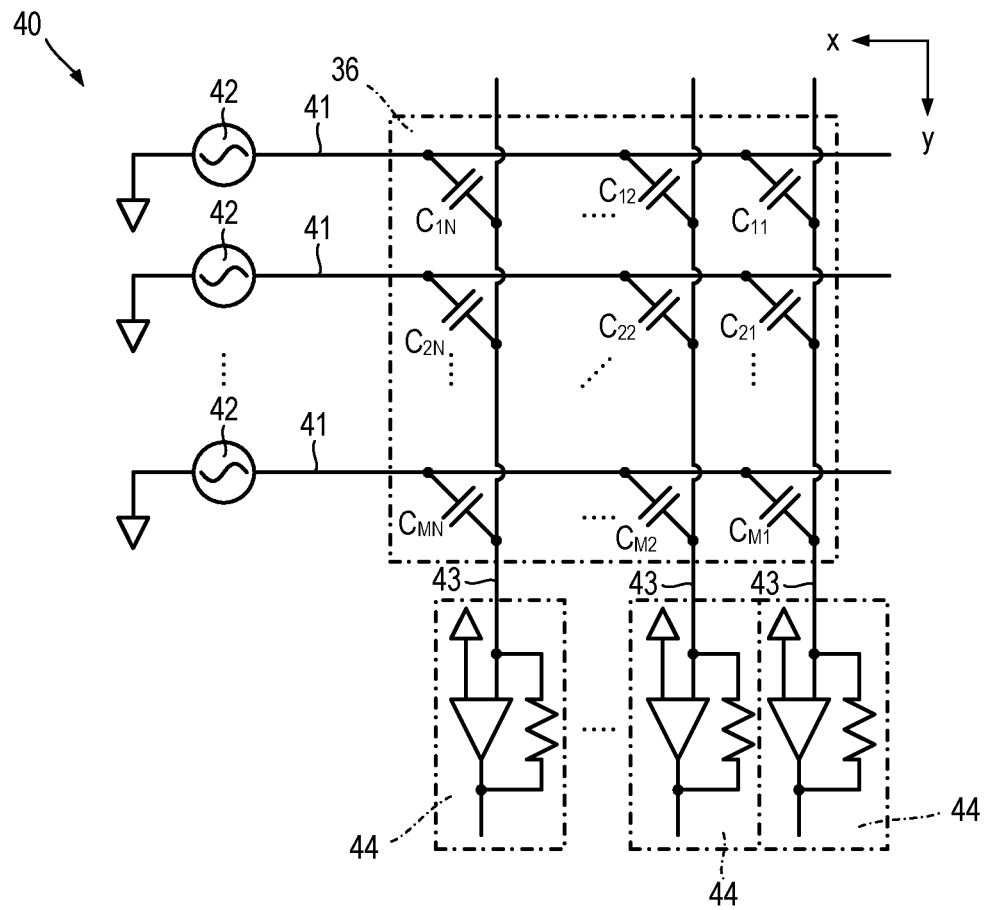
FIG. 4 schematically illustrates an active sensing layer associated with the first photo-capacitance sensor.

Referring also to FIG. 4, the photo-capacitors 32 are arranged in an array 36, for example a two-dimensional Cartesian array as shown in FIG. 4. The array 36 may include N rows and M columns of photo-capacitors 32, with N and M each being integers greater than or equal to 2, and where N and M may be equal or different. Let a capacitance of the photo-capacitor 32 corresponding to the $n^{th}$ of N rows and $m^{th}$ of M columns be denoted $C_{mn}$. Unless otherwise specified, reference to a photo-capacitor 32, $C_{mn}$ should be presumed to refer to the photo-capacitance contribution $C_{photo}$ and not to the geometric contribution $C_{dark}$. The geometric contributions $C_{dark}$ are assumed to be the same for all photo-capacitors 32, with any slight differences accounted for during calibration of the photo-capacitance sensor 29. The array 36 of photo-capacitors 32 is arranged to receive reflected light 38 which corresponds to reflections of the emitted light 37 from an object 39 in contact with, or proximate to, the illuminated portion 35 (FIG. 14) of the input surface 30. The array 36 of photo-capacitors 32 is configured for detecting a reflective pattern of the object 39.

In FIG. 3, the reflective pattern is illustrated as skin ridges corresponding, for example, to a fingerprint (which includes a thumbprint). This is an example of a reflective pattern formed by relief (height) of the object 39 surface. However, a reflective pattern for detection using the photo-capacitance sensor 29 is not restricted to reflective patterns generated by surface relief of an object 39. In general, the photo-capacitance sensor 29 may be employed for detecting reflective patterns in the form of albedo patterns, colour patterns, or any other patterning of the object 39 capable of generating a pattern of spatially varying reflectance. In particular, detection of human skin ridges is not restricted to fingerprints (including thumbprints), and could also be applied to palm prints, or any other portion of the body having a distinctive pattern of skin ridges and troughs.

The pitch (or spacing) of photo-capacitors 32 within the array 36 should be configured to provide sufficient spatial resolution to resolve a reflective patterns of the object 39 which it is desired to measure. In the example of fingerprint measurement shown in FIGS. 3 and 4, the spacing of rows and columns of the photo-capacitors 32 should be small enough to enable detection of human skin ridges such as those which form fingerprints. However, in general the pitch or spacing between photo-capacitors 32 forming the array 36 may be tailored for the desired application, and may be less than 1 mm, less than 0.5 mm, equal to a spacing of pixels in an associated display screen, and so forth.

Figure 19:
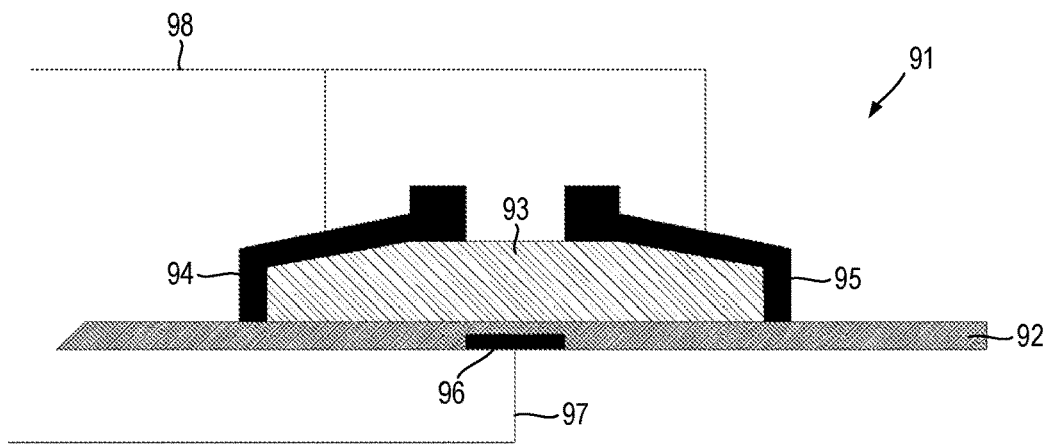
FIG. 19 is a schematic cross-section of a thin-film transistor (TFT) integrated photo-capacitor shown in FIG. 18.

Each photo-capacitor 32 includes a photo-capacitive material layer 2 as described hereinbefore, and may have the structure of the photo-capacitor 1. Alternatively, as described further hereinafter, each photo-capacitor 32 may have a structure similar to a thin-film transistor (TFT), except with the source and drain electrodes shorted (FIG. 19). The photo-capacitive material layer 2 of each photo-capacitor 32 may include, or be formed from, a disordered, crystalline or polycrystalline material, so as to include trap states in a bandgap of the material which are able to absorb sub-gap photon energies. The photo-capacitive material layer 2 of each photo-capacitor 32 may include, or be formed from, one or more of amorphous silicon, amorphous semiconducting oxides, organic materials, and so forth.

The photo-capacitance sensor 29 may be implemented as part of a passive sensor and/or a passive sensing layer (not shown). In the example shown in FIG. 4, the photo-capacitance sensor 1 is implemented as part of an active sensing layer 40.

The active sensing layer 40 includes a number M of transmitting lines 41, each connected to a respective signal source 42. The active sensing layer 40 also includes a number N of receiving lines 43, each connected to a respective detector circuit 44. The photo-capacitor 32 $C_{mn}$ connects the $m^{th}$ of M transmitting lines 41 to the $n^{th}$ of N receiving lines 43. In use, the array 36 is scanned by exciting the transmitting lines 41 one at a time with a time varying signal, whilst detecting the capacitances $C_{mn}$ of the connected photo-capacitors 32 from the receiving lines 43 using the respective detector circuits 44. Detection may be based on a charge stored by each photo-capacitor 32, a phase difference of the time varying signal between transmitting and receiving lines 41, 43, or any other technique known in the art for measurement of capacitances. For example, if the $m^{th}$ transmitting line 41 is excited with the time varying signal, then the photo-capacitances 32 $C_{m1}, C_{m2}, \ldots, C_{mN}$ are measured, followed by excitation of the $m+1^{th}$ transmitting line to measure the next set of photo-capacitors 32.

In other examples, a single signal source 42 may be connected to each of the transmitting lines 41 using a multiplexer (not shown), or a number of signal sources 42 which is fewer than M may be connected to groups of transmitting lines 41 using a corresponding number of multiplexors (not shown). In some examples, a single detector circuit 44 may be connected to each of the receiving lines 43 using a multiplexer (not shown), or a number of detector circuits 44 which is fewer than M may be connected to groups of receiving lines 43 using a corresponding number of multiplexors (not shown).

In the example of the photo-capacitance sensor 29 shown in FIG. 3, the array 36 of photo-capacitors 32 is disposed between the one or more light sources 31 and the input surface 30. Consequently, emitted light 37 may impinge on the photo-capacitors 32 in addition to reflected light 38. There are a number of possible approaches to mitigate this and substantially limit a sensitivity of detection to changes in the photo-capacitance $C_{photo}$ component of the monitored photo-capacitances $C_{mn}$.

A first approach is to simply include the photo-capacitance from emitted light 37 in a baseline capacitance $C_{base}$ which includes the geometric contributions $C_{dark}$ of each photo-capacitor 32. For example, if the photo-capacitance contribution $C_{photo}$ is split into a contribution $C_{emit}$ from emitted light 37 and a contribution $C_{reflect}$ from reflected light 38, then the desired signal $C_{reflect}$ may be obtained as:

$$C_{reflect} = C_{total} - C_{base} \quad (3)$$

with the baseline capacitance $C_{base}$ as:

$$C_{base} = C_{emit} + C_{base} \quad (4)$$

This approach would be easy to implement in existing capacitance measurement systems, for example as used for capacitive touch, as these are typically only concerned with changes in capacitance rather than absolute values.

A second approach to screening out effects of emitted light 37 on photo-capacitors 32 is to use a number of light sources 31 which are directional, and to arrange the light sources 31 in the gaps between photo-capacitors 32 to emit light 37 towards the input surface 30. Such a staggered arrangement (i.e. interpenetrating arrays of photo-capacitors 32 and light sources 31) may minimise the amount of emitted light 37 impinging on the photo-capacitors 32 whilst still illuminating the input surface 30.

Another approach to screening out effects of emitted light 37 on photo-capacitors 32 is to use an optional patterned light attenuating layer 45 disposed between the photo-capacitors 32 and the light source(s) 31. The light attenuating layer 45 is configured to screen the photo-capacitors 32 from direct illumination by emitted light 37 from the one or more light sources 31, at least within a wavelength range to which the photo-capacitors 32 are sensitive. For example, the light attenuating layer 45 may include gaps 46 corresponding to the spaces between photo-capacitors 32 forming the array 36. The light attenuating layer 45 may be opaque and may substantially or completely block emitted light 37. Alternatively, the light attenuating layer 45 may be selectively light blocking, and may take the form of a filter configured to block light within a wavelength range to which the photo-capacitors 32 are sensitive. In a further alternative, if the emitted light 37 is polarised, the light attenuating layer 45 may be a polariser which blocks polarised emitted light 37.

The light attenuating layer 45 may be a separate layer from the photo-capacitors 32 as illustrated in FIG. 3. However, in some examples the light attenuating layer 45 may be integrated with each photo-capacitor 32. For example, a lowermost of the first and second electrode 3, 4 may be an opaque electrode 24 or an electrode patterned as a polariser.

The photo-capacitors 32 do not need to be disposed between the light source(s) 31 and the input surface 30.

Figure 5:
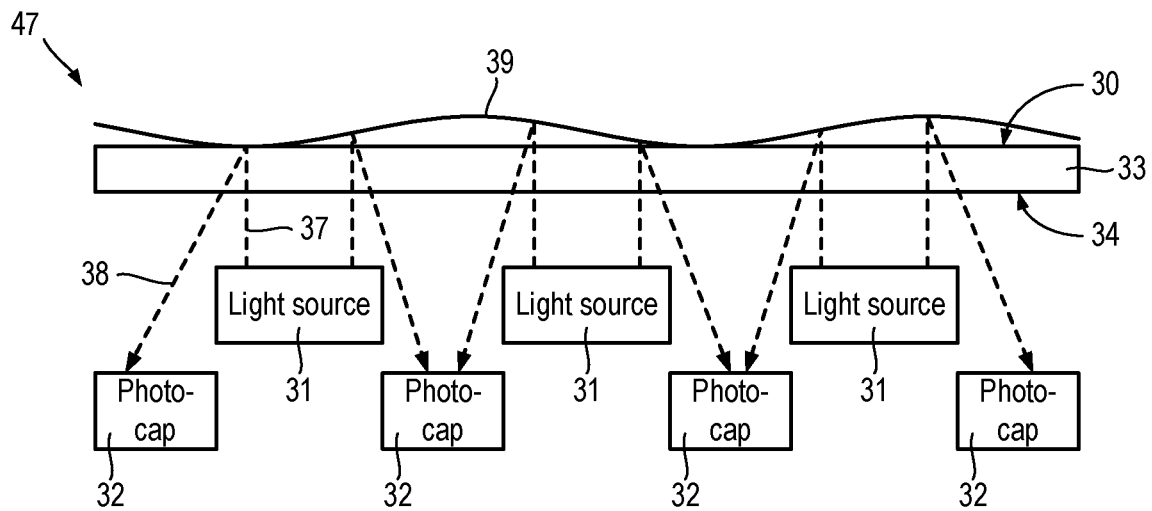
FIG. 5 schematically illustrates a second photo-capacitance sensor.

For example, referring also to FIG. 5, a second photo-capacitance sensor 47 is shown.

The second photo-capacitance sensor 47 is the same as the photo-capacitance sensor 29 (hereinafter referred to as the "first" photo-capacitance sensor 29), except that the one or more light sources 31 are directional and emit light 37 towards the input surface 30, and that the one or more light sources 31 are disposed (vertically, i.e. along axis z as drawn) between the array 36 of photo-capacitors 32 and the input surface 30.

For example, the one or more light sources 31 may include a number of light sources 31 arranged over the gaps between the photo-capacitors 32 to form an interpenetrating array (or e.g. a single large area emitter having gaps corresponding to photo-capacitors 32). In this way, light reflected from the pattern of the object 39 may pass through gaps between the light sources 31 to reach photo-capacitors 32. Alternatively, if the light source(s) 31 is (are) transparent to the reflected light 38 then one or more light sources 31 may laterally overlap (or entirely cover) underlying photo-capacitors 32.

In a still further example, the photo-capacitors 32 and directional light sources 31 may be substantially co-planar.

The photo-capacitance sensors 29, 47 may be implemented as part of a button, a touch pad, a touch panel, a touch screen, and so forth. An advantage of the photo-capacitance sensors 29, 47 is that they may be operable even when the input surface 30 is wetted by, and/or submerged in, water or any other fluid, provided that fluid is transparent at wavelengths emitted by the light source(s) 31 and to which the photo-capacitors 32 are sensitive.

The one or more light sources 31 are not particular limited, and may take the form of a single, large area emitter such as a light-emitting diode (LED) or an organic light-emitting diode (OLED). Alternatively, one or more light sources 31 may form an array of a single type of light emitter (e.g. LED or OLED), or an array of sub-pixels, each sub-pixel including two or more different types (e.g.

colours) of light emitter. In some examples, the light source(s) 31 may be provided by one or more pixels or sub-pixels of a display device.

Some, or all, of the one or more light sources 31 may take the form of infrared (IR) emitters, for example IR LEDs or IR OLEDs. An infrared emitter may correspond to a peak emission in the range between (and inclusive of) 800 nm and 2,500 nm. Some, or all, of the one or more light sources 31 may take the form of emitters selected from red, green and blue emitters, for example LEDs or OLEDs. A sub-pixel may include, for example, a red light source 31, a green light source 31 and a blue light source 31.

The photo-capacitance sensors 29, 47 may optionally include one or more conductive traces (not shown) for conducting projected capacitance measurements. Alternatively, electrodes defining the photo-capacitors 32 may also be used to conduct capacitive touch measurements, either sequentially (time multiplexed) or concurrently with measurements of photo-capacitance.

Integration with Display Screens

Although the photo-capacitance sensors 29, 47 may be used as stand-alone sensors for measuring reflective patterns of objects 39, the photo-capacitance sensors 29, 47 may also be integrated with a wide range of different display types and in a wide variety of locations within those display types. A cover lens of such an integrated display may provide the input surface 30.

For example, photo-capacitance sensors 29, 47 may be embedded in active matrix liquid crystal display (AMLCD) and/or active matrix OLED (AMOLED) architectures. Because of the principle of capacitance change when illuminated, the photo-capacitance sensors 29, 47 may be fully compatible to implement in existing capacitive touch systems which also rely on change in capacitance. An amorphous layer providing the photo-capacitive layer 2 can be integrated as a passive dielectric layer in any existing capacitive touch panel, or in other examples may be kept as an independent layer in terms of a separate readout but using the same readout infrastructure.

—Under-Display Architectures—

Photo-capacitance sensors 29, 47 can be placed below a pixel layer of a display, and each photo-capacitor 32 may be configured as a simple passive capacitor which may have a standard readout which is fed to a standard touch controller (not shown) which is connected to the display. The touch controller (not shown) may readout the photo-capacitor 32 array 36 within a separate time-period to capacitive touch measurements.

Figures 6, 7:
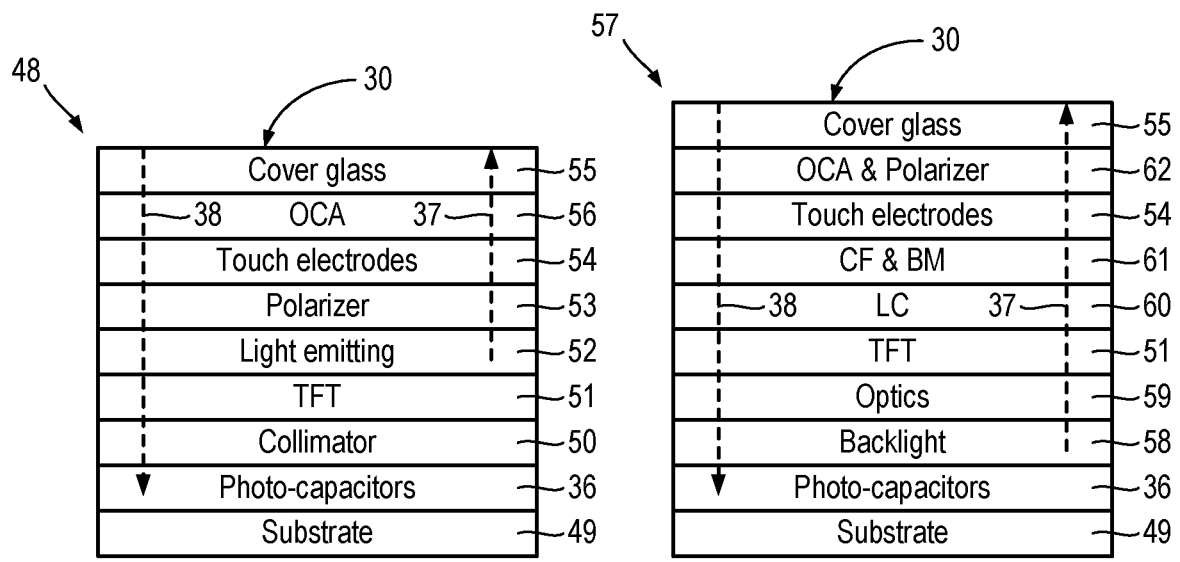
FIG. 6 is a schematic cross section of a first under-display stack-up.
FIG. 7 is a schematic cross section of a second under-display stack-up.

For example, referring to FIG. 6, a first under-display stack-up 48 is shown.

The first under-display stack-up 48 includes, stacked in a direction between a substrate 49 and the input surface 30, an array 36 of photo-capacitors 32, a collimating layer 50, a TFT layer 51, a light emitting layer 52 (providing the light source(s) 31), a polarizing layer 53, an optional capacitive touch electrode layer 54, and a cover glass 55. The layers 36, 50, 51, 52, 53, 54 are supported on the substrate 49, and the stack is bonded to the cover glass 55 with a layer of optically clear adhesive (OCA) 56. The first under-display stack-up 48 generally corresponds to, for example, a LED or OLED type display panel and similar.

The collimating layer 50 is a Light control film (LCF), also known as light collimating film, which takes the form of an optical film that is configured to regulate the directionality of transmitted light. The collimating layer 50 may take the form of, for example, a micro lens array, a pinhole array or an optical wave-guiding grid. The collimating layer 50 provides for maximum transmission at a predetermined angle of incidence with respect to the image plane and provides for image cut-off or black-out along a given polar coordinate depending on the application requirement. The TFT layer 51 controls illumination of the pixels forming the light emitting layer 52. The light emitting layer 52 is formed of pixels or sub-pixels of light emitters in the form of LEDs, OLEDs, or ultra-LEDs (uLEDs). The light-emitting layer 52 may take the form of a standard, RGB pixel display, or alternatively each sub-pixel may include red, green, blue and IR emitters.

The cover glass 55 may be any suitable material for use in a touchscreen display, for example glass, transparent polymers, and so forth.

Referring also the FIG. 7, a second under-display stack-up 57 is shown.

The second 62 under-display stack-up 57 includes, stacked in a direction between a substrate 49 and the input surface 30, an array 36 of photo-capacitors 32, a backlight layer 58 (providing the light source(s) 31), an optics layer 59, a TFT layer, a liquid crystal (LC) layer 60, a colour filter (CF) and black matrix (BM) layer 61, an optional capacitive touch electrode layer 54, an OCA and polarizer layer 62 and a cover glass 55. The second 62 under-display stack-up 57 generally corresponds to, for example, a back-lit LCD panel or similar.

The TFT layer 51 controls switching of pixels defined by the LC layer 60 in combination with the colour filters of the CF and BM layer 61. The backlight layer 58 provides the light source(es) 31 and emitted light 37.

In either of the first and second under-display stack-ups 48, 57, the touch electrode layer 54 is optional and may be omitted. When present, the touch electrode layer 54 may be used to detect user touches. —Above-Display (or On-Cell) Architectures—

Figures 8, 9:
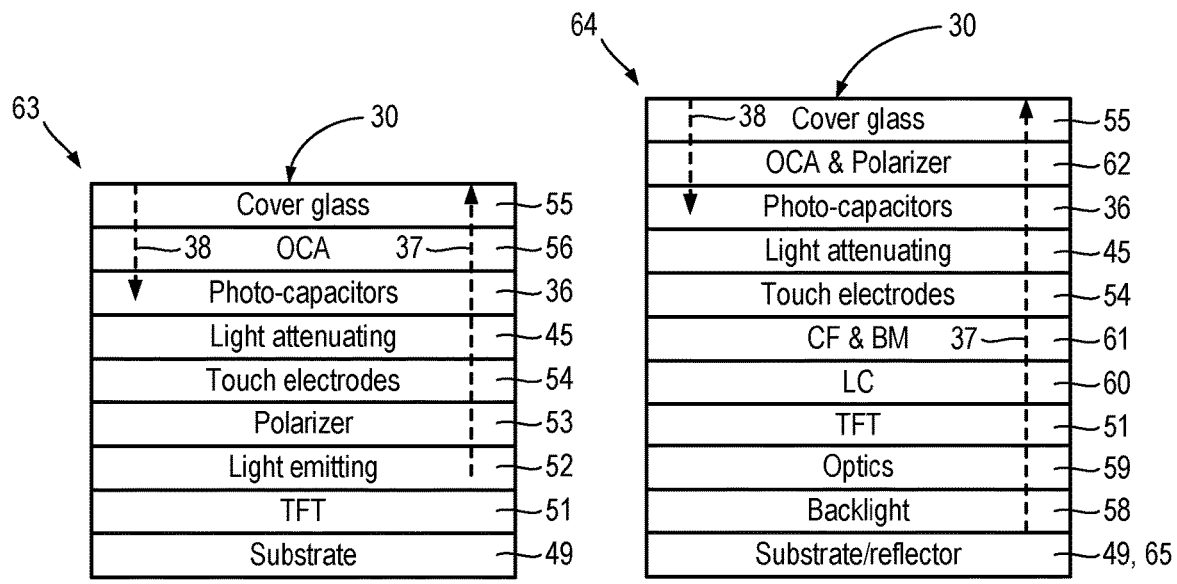
FIG. 8 is a schematic cross section of a first on-cell stack-up.
FIG. 9 is a schematic cross section of a second on-cell stack-up.

Referring also to FIG. 8 a first above-display (or "on-cell") stack up 63 is shown.

The first on-cell stack-up 63 is the same as the first under-display stack-up 48, except that the array 36 of photo-capacitors 32 is between the polarizer 53 (as shown above the optional capacitive touch electrodes 54) and the OCA layer 56, instead of between the substrate 49 and the TFT layer 51. Optionally, a light attenuating layer 45 may be included at any position between the array 36 and the light emitting layer 52.

The first on-cell stack-up 63 is reminiscent of standard on-cell capacitive touch architectures, and the array 36 may be integrated into a capacitive touch stack and may be readout using the same readout technique and touch controller (not shown) as capacitive touch. Preferably, the capacitive touch and photo-capacitance signals are not blended, but are instead time multiplexed for readout. In this way, the photo-capacitance measurements may be integrated using the same readout infrastructure as capacitive touch, simplifying the electronics. Alternatively, the photo-capacitance measurements may have separate readout electronics to a capacitive touch function.

Referring also to FIG. 9 a second above-display (or "on-cell") stack up 65 is shown. The second on-cell stack-up 64 is the same as the second under-display stack-up 57, except that the array 36 of photo-capacitors 32 is between the CF & BM layer 61 (as shown above the optional capacitive touch electrodes 54) and the OCA and polarizer layer 62, instead of between the substrate 49 and the backlight layer 58. Optionally, the substrate 49 may be configured as a reflector 65. Optionally, a light attenuating layer 45 may be included at any position between the array 36 and the backlight layer 58.

The second on-cell stack-up 64 has corresponding advantages to the first on-cell stack-up in relation to integration with capacitive touch.

—In-Display (or In-Cell) Architectures—

Figures 10, 11:
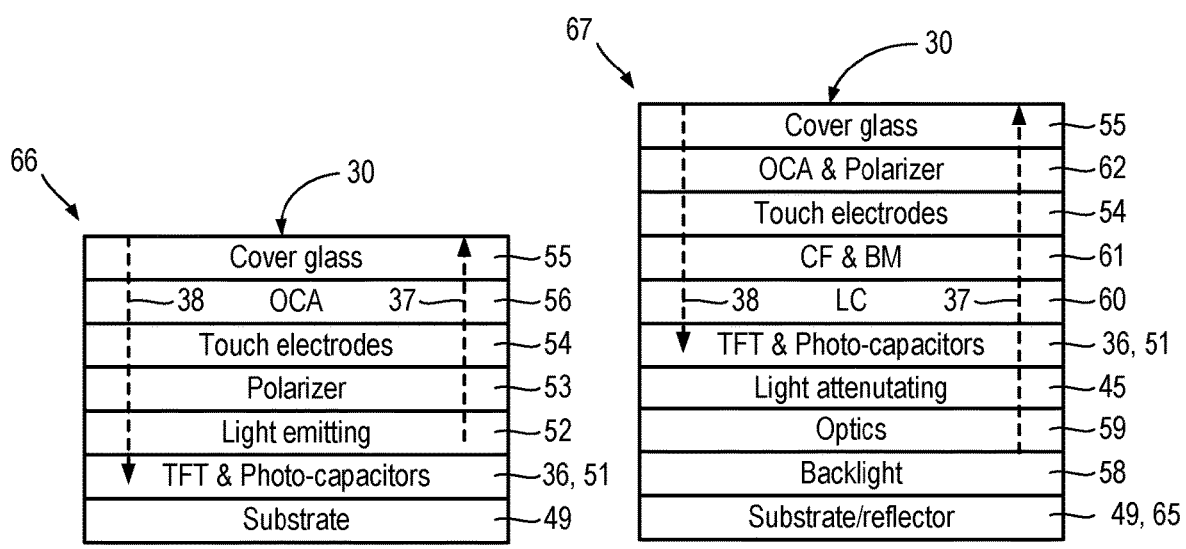
FIG. 10 is a schematic cross section of a first in-cell stack-up.
FIG. 11 is a schematic cross section of a second in-cell stack-up.

Referring also to FIG. 10, a first in-display (or in-cell) stack-up 66 is shown.

The first in-cell stack-up 66 is the same as the first under-display stack-up 48 or the first on-cell stack-up 63, except that instead of being a separate layer, the array 36 of photo-capacitors 32 is integrated with the TFT layer 51. In this way, the photo-capacitors 32 may use the same amorphous Si layer as defines the TFTs to provide the photo-capacitive material layer 2, simplifying fabrication and reducing the number of layers. Even further integration is possible, since a TFT structure can be modified to provide a photo-capacitor 32 by shorting the source and drain electrodes together (FIG. 19). In use, a corresponding photo-capacitance $C_{photo}$ may then be read between the shorted source and drain electrodes and the gate electrode.

Smartphones which run on low temperature poly-silicon (LTPS) transistors for TFT layers 51 may already include a-Si:H for use as a photo-capacitive material layer 2. Indeed, LTPS are often formed from laser-crystallised a-Si:H. Consequently, fabricating the array 36 and the TFT layer 51 from a single material layer may provide a synergistic reduction in the number and complexity of fabricating a display with an integrated photo-capacitance sensor.

The readout of capacitances from the array 36 would be the same as any touch panel described hereinbefore in which the capacitances are readout out by a touch controller (not shown) during a separate time period from standard capacitive touch, for example, through appropriate logic gating.

Referring also to FIG. 10, a second in-display (or in-cell) stack-up 67 is shown.

The second in-cell stack-up 67 is the same as the second under-display stack-up 57 or the second on-cell stack-up 64, except that instead of being a separate layer, the array 36 of photo-capacitors 32 is integrated with the TFT layer 51. Optionally, a light attenuating layer 45 may be included between the TFT and photo-capacitor layer 36, 51 and the backlight layer 58.

The second in-cell stack-up 67 provides similar advantages to the first in-cell stack-up 66, but for LC display architectures.

—On-Display (or On-Cell) Architecture—

Referring also to FIG. 12, a third on-cell stack-up 68 is shown.

The third on-cell stack-up 68 is the same as the first on-cell stack-up 63, except that the array 36 is moved to be between the light emitting layer 52 and the polarizing layer 53, instead of between the polarizing layer 53 and the cover glass 55. Optionally a light attenuating layer 45 may be included between the array 36 and the light emitting layer 52.

Referring also to FIG. 13, a fourth on-cell stack-up 69 is shown.

The fourth on-cell stack-up 69 is the same as the third on-cell stack-up 64, except that the array 36 is moved to be between the LC layer 60 and the CF and BM layer 61, instead of between the CF and BM layer 61 and the cover glass 55. Optionally a light attenuating layer 45 may be included between the array 36 and the backlight layer 58.

For both the third and fourth on-cell stack-ups 68, 69, the capacitive touch electrode 54 now sit above the light emitting layer 52 and LC layer 60 respectively. The photo-capacitive layer 2 of the array 36 of photo-capacitors 32 may be made of the same or equivalent material as the TFT layer 51, but its implementation may be in the form of a passive capacitor (see FIG. 1).

Although a range of different display stack-ups have been described, the use of photo-capacitance sensors 29, 47 according to the present specification is not limited to the explicitly described display stack-ups, and photo-capacitance sensors 29, 47 may be added between (or integrated with where compatible) layers of any type of display architecture.

Extent of Illuminated Portion

The illuminated portion 35 (FIG. 14) generally corresponds to the extent of the array 36 of photo-capacitors 32. For example, in a display, the display pixels may illuminate substantially the entire cover glass 55 providing an input surface 30. However, the illuminated portion 35 is regarded as the portion of the input surface 30 which overlies the array 36 of photo-capacitors 32.

Referring also to FIG. 14, a first display layout 70 is shown.

A device 71 includes a display area 72. In the first display layout 70, the illuminated portion 35 corresponding to a photo-capacitance sensor 29, 47 corresponds to a first region 73 of the display area 72. In the example shown in FIG. 14, the first region 73 runs substantially along an edge of the display area 72. However, the shape, relative size and relative position of the first region 73 within the display area 72 are not limited to the specific illustration in FIG. 14. For example, the first region 73 could be centrally located in the display area 72.

In this way, a region 73 of the display of a device 71 such as a phone or a tablet computer may be provided with a photo-capacitance sensor 29, 47 which may sense a user fingerprint (fingerprints include thumb prints). This may allow the use of fingerprint authentication to, for example, unlock the phone and/or authorise transactions, without sacrificing any display area 72 to a separate button or reader.

Referring also to FIG. 15, a second display layout 74 is shown.

The second display layout 74 is the same as the first display layout 70 and further includes an additional photo-capacitance sensor 29, 47 which has an illuminated portion 35 corresponding to a second region 75 of the display area 72 which is different to the first region 73. In the example shown in FIG. 15, the first region 73 runs along a first edge of the display area 72 and the second region 75 runs along a second, opposite edge of the display area 72. However, any two shapes, positions and relative sizes for the distinct regions 73, 75 may be defined depending on the intended application.

Referring also to FIG. 16, a third display layout 76 is shown.

The third display layout 76 is the same as the first display layout 70, except that the first region 73 extends around the entire periphery of the display area 72.

However, the illuminated portion 35 is not restricted to only a region 73, 75 of the display area 72, and in some examples the illuminated portion 35 may be co-extensive with the display area 72. For example, referring also to FIG. 17, a fourth display layout 77 is shown in which the illuminated portion 35 is co-extensive with the display area 72.

Example of Integrating Photo-Capacitors in a TFT Layer

Figure 18:
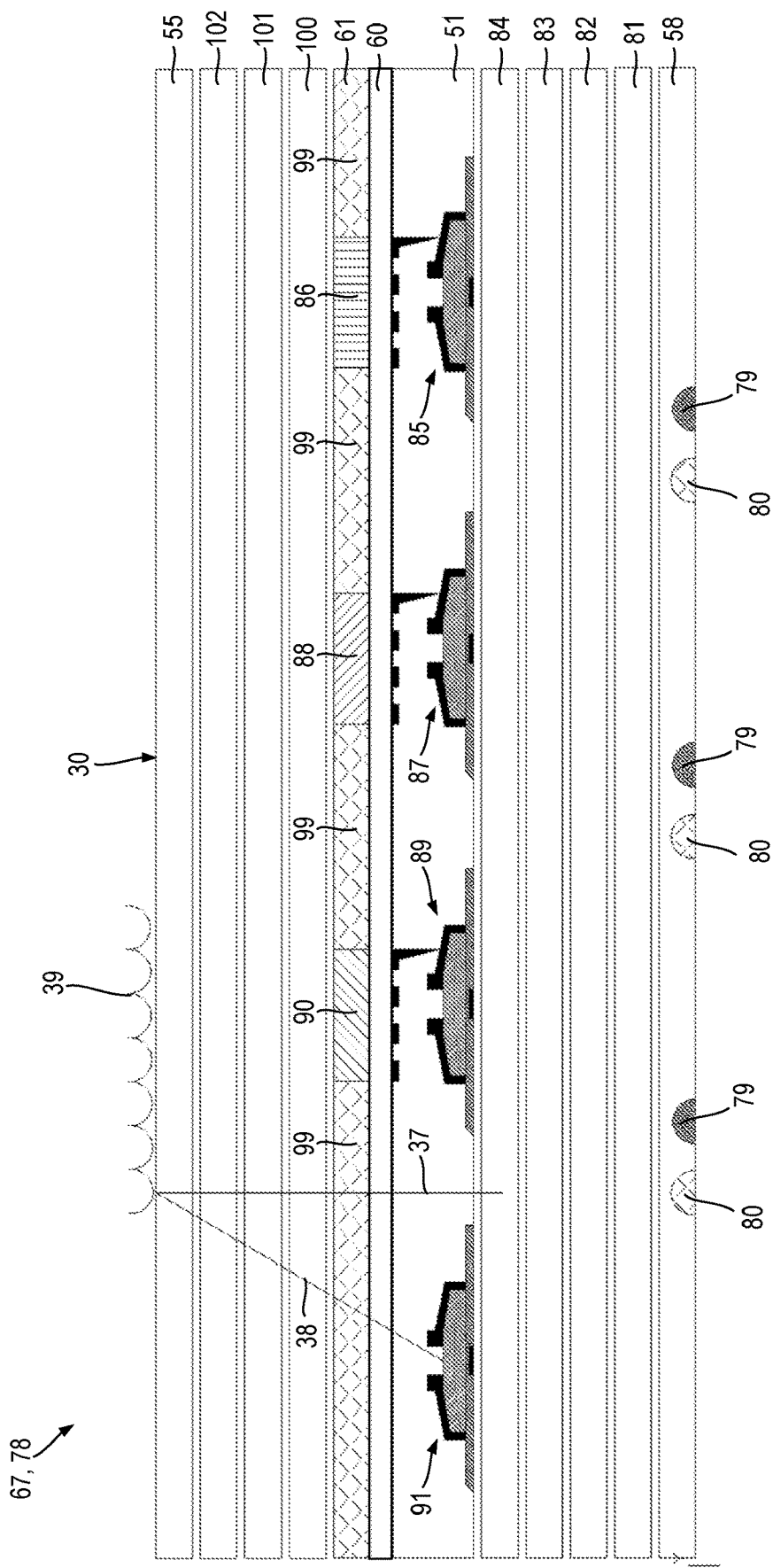
FIG. 18 is a schematic cross-section of a specific example of the second in-cell stack-up of FIG. 11.

Referring also to FIGS. 18 and 19, a specific example 78 of the second in-cell stack-up 67 shall be described to provide one exemplary method of integrating an array 36 of photo-capacitors 32 into a TFT layer 51.

In the illustrated example, the backlight layer 58 includes a mixture of white LEDs 79 (or OLEDs) and IR LEDs 80 (or OLEDs). Between the backlight layer 58 and the TFT layer 51 are stacked a back-light diffuser layer 81, an optical film layer 82, a first polarizing layer 83 and a patterned conductive layer 84 providing electrical connections to one side of the TFT layer 51.

The TFT layer 51 includes blue pixels 85 corresponding to blue filters 86 of the CF and BM layer 61, green pixels 87 corresponding to green filters 88 of the CF and BM layer 61, red pixels 89 corresponding to red filters 90 of the CF and BM layer 61, and TFT integrated photo-capacitors 91.

Referring in particular to FIG. 19, each TFT integrated photo-capacitor 91 includes a dielectric layer 92 supporting a semiconductor region 93 which has photo-capacitive properties. A source electrode 94 is deposited on one side of the semiconductor region 93 and a drain electrode 95 is deposited on an opposite side to define a channel between the source and drain electrodes 94, 95. A gate 96 is deposited on an opposite side of the dielectric 92 to the semiconductor region 93. A first conductive trace 97 connects to the gate electrode 96, and a second conductive trace 98 is connected to both the source and drain electrodes 94, 95. Consequently, the source and drain electrodes 94, 95 are shorted together. A capacitance $C_{photo}$ is measured between the gate 96 and the coupled source and drain electrodes 94, 95

In this way, the TFT integrated photo-capacitor 91 can have an identical structure to the pixel defining TFT's 85, 87, 89, with changes only needed to the layout of conductive traces connecting to the TFT layer 51. This allows TFT integrated photo-capacitors 91 to be added almost seamlessly to fabrication of conventional display TFT layers.

Each of the blue, green and red pixels 85, 87, 89 has a conventional configuration for pixels of a backlit LCD display.

The CF and BM layer 61 also includes conventional black matrix (BM) material 99. Preferably the BM material 99 is transparent to IR wavelengths emitted by the IR LED/OLEDs 80, so that emitted light 37 may reach the input surface 30 and object 39, and reflected light 38 may reach the TFT integrated photo-capacitors 91. Additionally or alternatively, the BM material 99 may include additional apertures (not shown) to allow passage of the emitted light 37 and reflected light 38, for example between the input surface 30 and the TFT integrated photo-capacitors 91.

Between the CF and BM layer 61 and the cover glass 55 are stacked, in order, a second polarizing layer 100, an optically clear adhesive layer 101 and a third polarizing layer 102.

Apparatus Including the Photo-Capacitance Sensor

Figure 20:
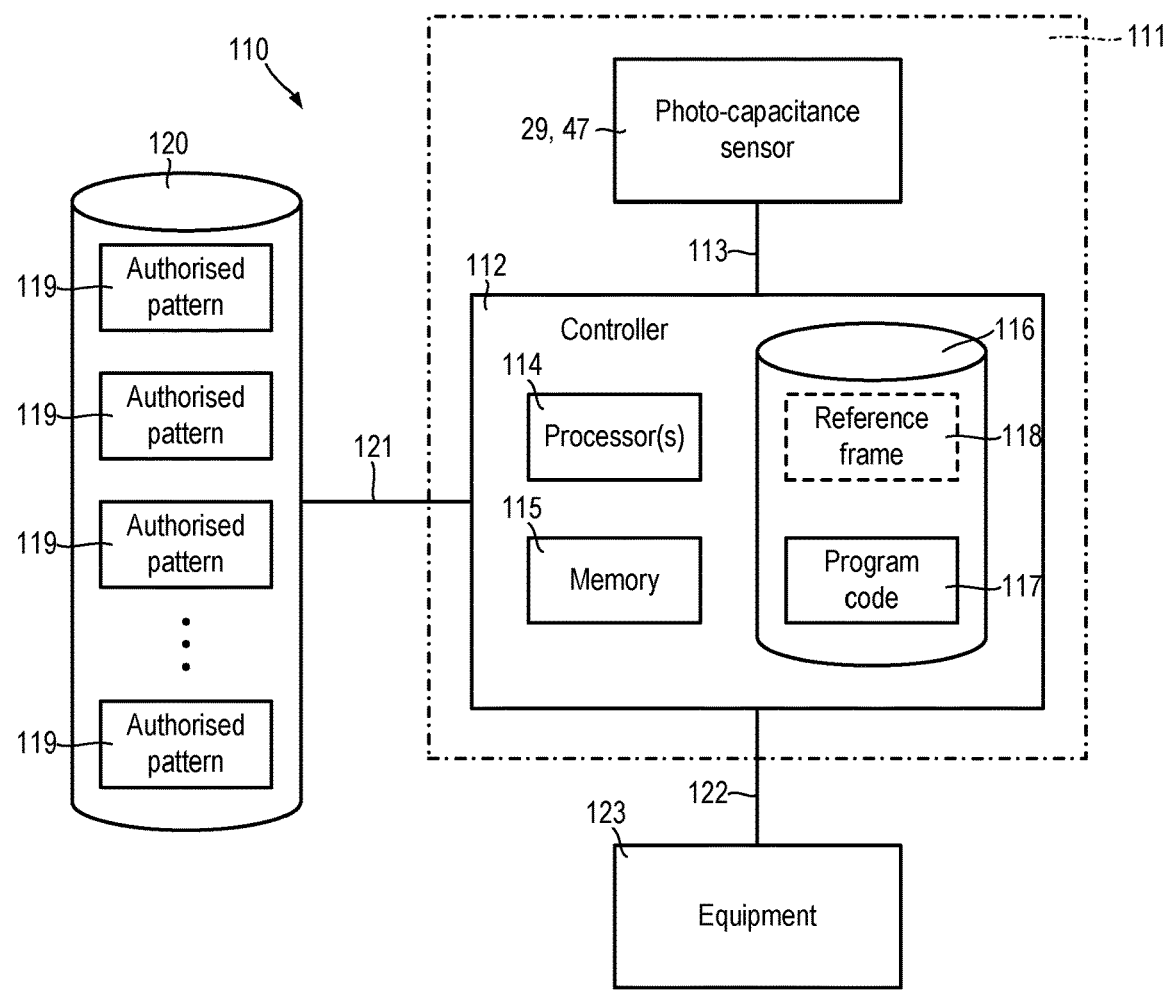
FIG. 20 schematically illustrates a system for photo-capacitance sensing.

Referring also to FIG. 20, a system 110 is shown.

The system includes an apparatus 111 including a photo-capacitance sensor 29, 47 and a controller 112.

The controller 112 is connected to the photo-capacitance sensor 29, 47 via a link 113, and the controller 112 is configured to measure capacitances $C_{mn}$ of the array 36 of photo-capacitors 32.

In relation to the examples described hereinbefore, the controller 112 may be a touch controller, and the system 110 may also include a display which the photo-capacitance sensor 29, 47 is under, over, or integrated within. In other words, the system 110 and apparatus 111 may be parts of a larger device such as a phone, a tablet computer and so forth.

Alternatively, the system no could form part of an access control system for a device other than a phone or tablet, as described hereinafter.

The controller 112 includes one or more processors 114, volatile memory 115 and non-volatile storage 116. The non-volatile storage 116 stores program code 117 for controlling the controller to measure the capacitances $C_{mn}$ of the array 36 of photo-capacitors 32, as well as to perform other functions described herein. The controller 112 will also include outputs for controlling signal sources 42, or may directly output time varying signals for measurement of capacitances $C_{mn}$ directly. Similarly, the controller 112 may also include one or more detector circuits 44. In some examples, a device such as a phone, a tablet computer and so forth which incorporates the photo-capacitance sensor 29, 47 may provide some, or all, of the necessary data processing capacity, volatile and non-volatile storage.

Optionally, the controller 112 may store a reference frame 118 in the storage 116 which corresponds to the measured capacitances $C_{base}$ of the array 36 of photo-capacitors when the one or more light sources are illuminated in the absence of the object 39 above or in contact with the input surface. The controller may be configured to subtract the reference frame 118 from the capacitances $C_{mn}$ measured from the array 36 of photo-capacitors 32 in order to implement Equation (3) as described hereinbefore.

Optionally, the controller 112 may additionally be configured to control the light emission from the one or more light sources 31 of the photo-capacitance sensor 29, 47. In such examples, to save power, the controller 112 may only illuminate the light sources 31 when it is desired to measures the capacitances $C_{mn}$ of the array 36 of photo-capacitors 32. For example, if light sources 31 take the form of IR emitters integrated into an RGB display, then the IR emitters may not need to be illuminated at all times. If the display includes capacitive touch sensing functions, then the controller 112 may illuminate the IR emitters (light sources 31) in response to capacitive touch detection, in order to measure a fingerprint pattern of someone touching the input surface 30.

One possible advantage of photo-capacitors for fingerprint (or other skin pattern) sensing, as compared to conventional capacitive fingerprint sensing may be in the possibility to check that a detected fingerprint pattern corresponds to a live human. For example, conventional capacitive fingerprint sensing is based on electrical conductance, and can be spoofed using mocked-up fingerprint patterns.

Using photo-capacitance sensors 29, 47, integrated with a display having red, green, blue and IR emission capability, the presence of oxygenated haemoglobin in a contacting object 39 may be checked. For example, the controller 112 may illuminate only red light sources 31 (pixels/sub-pixels) and measure a first set of capacitances $C_{mn}$ from the array 36, then illuminate only the IR light sources 31 (pixels/sub-pixels) and measure a second set of capacitances from the array 36. By comparing the first and second sets of capacitances $C_{mn}$, the controller 112 may determine a ratio of reflectance at red and IR wavelengths, and thereby differentiate living human skin from a spoofed fingerprint pattern. It may be noted that that determination of a ratio of reflectance at red and IR wavelengths may be performed using aggregated measurements for improved accuracy, as the spatial resolution is only needed for the pattern itself.

Once the controller 112 has measured a pattern of capacitances $C_{mn}$ from the array 36 of photo-capacitors 32, the pattern may be compared against a set of one or more authorised patterns 119. Each authorised pattern 119 may correspond to, for example, a fingerprint of a person who is authorised to use a device or equipment which is associated with the system 110, or to enter an area associated with the system 110. The comparison conducted by the controller 112 should not be sensitive to the relative rotation of the measured pattern of capacitances $C_{mn}$ (i.e. the controller 112 should have the capability to apply rotational transforms to one or both patterns). The authorised patterns 119 may be stored in a secure storage device 120 which communicates with the controller 112 using a wired or wireless link 121. Alternatively, the authorised pattern(s) 119 may be stored internally in the storage 116 of the controller 112. If the pattern of capacitances $C_{mn}$ measured using the array 36 matches any of the authorised patterns 119, the controller 112 outputs a signal using wired or wireless link 122 to equipment 123 associated with the photo-capacitance sensor 29, 47 indicating an authorised user is detected.

When the system 110 is integrated as part of a phone, tablet computer, or other device such as a printer or an item of medical equipment, the entire process may be internal to that device (i.e. the equipment 123 may simply be the rest of the device including the system 110).

When implemented as a stand-alone device, the apparatus 111 may act as an access control device for equipment 123 such as, for example, a printer, a medical device, a door, an elevator control panel, a motor vehicle, a motorcycle, a cycle, building plant such as; bulldozers, backhoes, excavators, aircraft, military equipment and so forth. Additionally or alternatively, the apparatus 111 may act as an access control device for doors or locks providing access to drug cabinets, hospital wards such as maternity and natal units, hotel guest room doors, hotel back of house doors, or any other room or space to which it is desired to control access.

Modifications

It will be appreciated that many modifications may be made to the embodiments hereinbefore described. Such modifications may involve equivalent and other features which are already known in the design and use of photo-capacitance sensors, biometric authentication sensors and/or scanners for fingerprints and/or other distinctive patterns, and which may be used instead of, or in addition to, features already described herein. Features of one embodiment may be replaced or supplemented by features of another embodiment.

Possible uses of the photo-capacitance sensors of the present specification, used for pattern detections, may include without being limited to, multiple digit simultaneous scanning of a hand print, for access to mobile phones; enabling secure in-app and on surface security fingerprint recognition, in general purpose displays, HID devices, enabling secure in app and on surface security fingerprint recognition. Other applications including engineering applications such as proving authorisation at the point of delivery of a service. Further applications including providing an authority audit trail.

Still further applications include medical displays, computers, MRI or other diagnostic machines, or any other medical equipment (e.g. only authorised staff can access controls of medical devices), in-application authorisation (e.g. printing prescriptions), audit trail and so forth.

Photo-capacitance sensors 29, 47 may be configured to allow through glove security, for example by using wavelengths which can be read through thin surgical or other types of PPE glove.

Photo-capacitance sensors 29, 47 may be used to replace, for example, card, code and/or key security in hospitals, laboratories, or any other facilities requiring access controls. The photo-capacitance sensors 29, 47 could be directly integrated into, for example, door handles, door push plates, locks and so forth.

Separate Read-Out of Projected Capacitance and Photo-Capacitance

The stack-ups 48, 57, 63, 64, 66, 67, 68, 69 described hereinbefore may include dedicated electrodes 54 for projected capacitance measurements. As noted hereinbefore, one option for such arrangements is to include separate readout electronics for photo-capacitance and capacitive touch functions.

Figure 21:
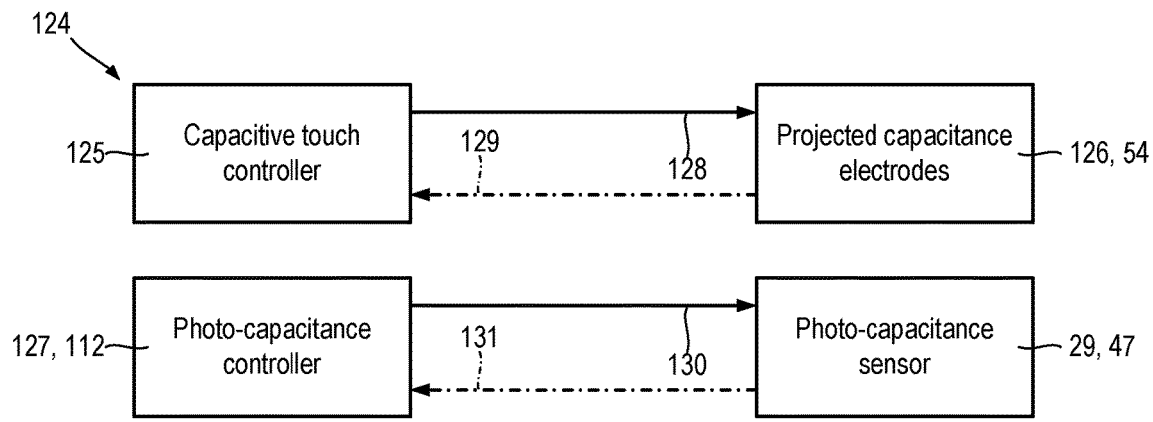
FIG. 21 schematically illustrates a separate readout configuration for projected capacitance and photo-capacitance.

For example, referring also to FIG. 21 a schematic of a separate readout configuration 124 is shown.

The separate readout configuration 124 includes a capacitive touch controller 125 coupled to projected capacitance touch electrodes 126, and a photo-capacitance controller 127 coupled to the photo capacitance sensor 27, 47. The photo-capacitance controller 127 is configured to measure photo-capacitances of the array 36 of photo-capacitors 32, 91 forming the photo-capacitance sensor 29, 47. The capacitive touch controller 125 is configured for projected capacitance touch sensing using the projected capacitance touch electrodes 126 (for example in the form of suitable conductive traces). The capacitive touch controller 125 provides driving signals 128 to the projected capacitance touch electrode 126, and determines capacitances for detecting user interactions based on corresponding received signals 129. Similarly, the photo-capacitance controller 127 provides driving signals 130 to the photo-capacitance sensor 29, 47, and corresponding received signals 131 may be used to determine a reflectance pattern as described hereinbefore.

The outputs and inputs of the capacitive touch controller 125 and/or the photo-capacitance controller 127 may be multiplexed to allow scanning a number of electrodes larger than a number of channels on the respective controller 125, 127.

The driving signals 128, 130 for projected capacitance measurements and photo-capacitance measurements may be different. For example, the time constants of projected capacitance touch electrodes 127 (or intersections therebetween) may be different to that of photo-capacitors 32. Additionally, and advantageously, frequency multiplexing the driving signals 128, 130 for projected capacitance measurements and photo-capacitance measurements will reduce cross-talk between the two measurements.

The projected capacitance touch electrodes 126 may take the form of, for example, capacitive touch electrode layer 54 described hereinbefore. The separate readout configuration 124 may be used for the system 110/apparatus 111, in which case the photo-capacitance controller 127 may take the form of controller 112 described hereinbefore. Equally, the photo-capacitance controller 127 may be provided by any controller configured to measure the photo capacitances of the photo-capacitance sensors 29, 47 described herein.

In some examples, the capacitive touch controller 125 and the photo-capacitance controller 127 may be provided by distinct channels of a single device. For example, a capacitive touch controller may include a number K of channels, of which the first 1 to k may be dedicated to projected capacitance measurements (providing capacitive touch controller 125), whilst the remaining k+1 to K channels are dedicated to photo-capacitance measurements (providing the photo-capacitance controller 127).

The capacitive touch controller 125 may be used for self-capacitance measurements or mutual capacitance measurements.

Time-Multiplexed Read-Out of Projected Capacitance and Photo-Capacitance

Figure 22A:
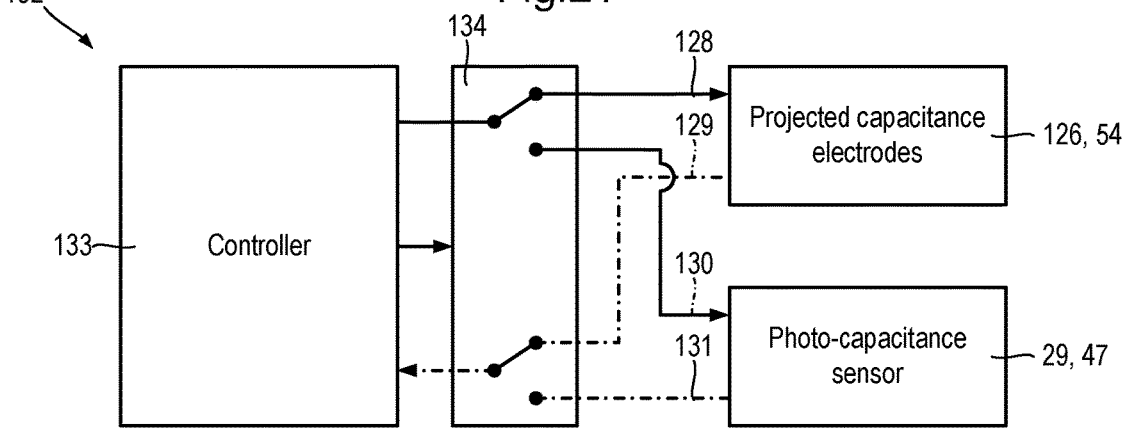
FIG. 22A schematically illustrates a time-multiplexed readout configuration for projected capacitance and photo-capacitance.

It is not essential to use separate electronics (or at least dedicated channels) for projected capacitance measurements and photo-capacitance measurements. Another option for stack-ups 48, 57, 63, 64, 66, 67, 68, 69 including dedicated electrodes 54 for projected capacitance measurements and a separate layer 36 of discrete photo-capacitors 32, 91 is to use a single capacitive touch controller and time-multiplex the measurements of projected capacitance and photo-capacitances. In this way, the photo-capacitance measurements may be integrated using the same readout infrastructure as capacitive touch, simplifying the electronics For example, referring also tot FIGS. 22A and 22B, a time-multiplexed readout configuration 132 is schematically illustrated The time-multiplexed readout configuration 132 includes a controller 133 connected via a switch network 134 to the projected capacitance touch electrodes 126 and the photo-capacitance sensor 29, 47. The controller 133 is configured to time multiplex, by controlling the switch network 134 to alternate between performing projected capacitance touch sensing and measurements of photo-capacitances from the photo-capacitance sensor.

Figure 22B:
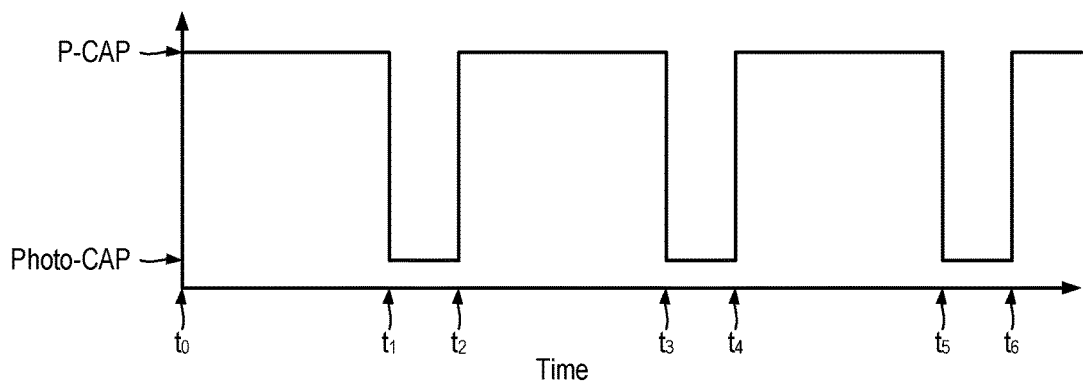
FIG. 22B schematically illustrates timings for the time-multiplexed readout configuration shown in FIG. 22A.

Referring in particular to FIG. 22B, during first periods such as $t_0$ to $t_1$, $t_2$ to $t_3$, $t_4$ to $t_5$ and so forth, the switch network connects controller 133 to the projected capacitance touch electrodes 126. Interspersed with the first periods are second periods such as $t_1$ to $t_2$, $t_3$ to $t_4$, $t_5$ to $t_6$ and so forth, during which the switch network connects controller 133 to the photo-capacitance sensor 29, 47 for photo-capacitance measurements.

The projected capacitance touch electrodes 126 may take the form of, for example, capacitive touch electrode layer 54 described hereinbefore. The time-multiplexed readout configuration 132 may be used for the system 110/apparatus 11, in which case the controller 133 may take the form of controller 112 described hereinbefore.

The switch network 134 may additionally provide multiplexing to enable a controller 133 with K channels to scan more than K drive/sense lines during the first, projected capacitance measurements periods $t_0$ to $t_1$, $t_2$ to $t_3$, $t_4$ to $t_5$ and/or to scan more than K photo-capacitors 32 during the second, photo-capacitance measurement periods $t_1$ to $t_2$, $t_3$ to $t_4$, $t_5$ to $t_6$.

Combined Read-Out of Projected Capacitance and Photo-Capacitance

As mentioned hereinbefore, electrodes defining the photo-capacitors 32, 91 may also be used to conduct capacitive touch measurements, either sequentially (time multiplexed) or concurrently with measurements of photo-capacitance. In such examples, separate projected capacitance electrodes 54, 126 may be omitted, simplifying a sensor/display stack-up structure.

Figure 23:
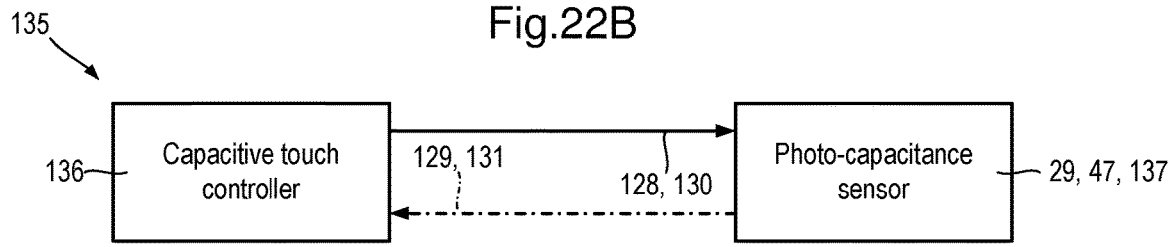
FIG. 23 schematically illustrates a combined readout configuration for projected capacitance and photo-capacitance.

For example, referring also to FIG. 23, a combined readout configuration 135 is shown.

The combined readout configuration 135 includes a controller 136 and the photo-capacitance sensor 29, 47. In the combined readout configuration 135, the controller 136 measures a capacitance of each photo-capacitor 32, 91 two or more times, and coordinates the light sources 31 to obtain at least a pair of measurements including a first corresponding to illumination of the photo-capacitors 32 and a second corresponding to a "dark" state in which the light sources 31 under the interaction site are not-illuminated.

The combined readout configuration 135 may be used for the system 110/apparatus 11, in which case the controller 136 may take the form of the controller 112 described hereinbefore.

Any of the photo-capacitor 32, 91 structures described hereinbefore may be used for the combined readout configuration 135, since any electrodes defining a photo-capacitor 32, 91 will include a geometric component of capacitance which will couple to a users' digit and/or conductive stylus, enabling touch sensing by projected capacitance.

However, the combined readout configuration 135 may also be applied to other configurations.

Figure 24:
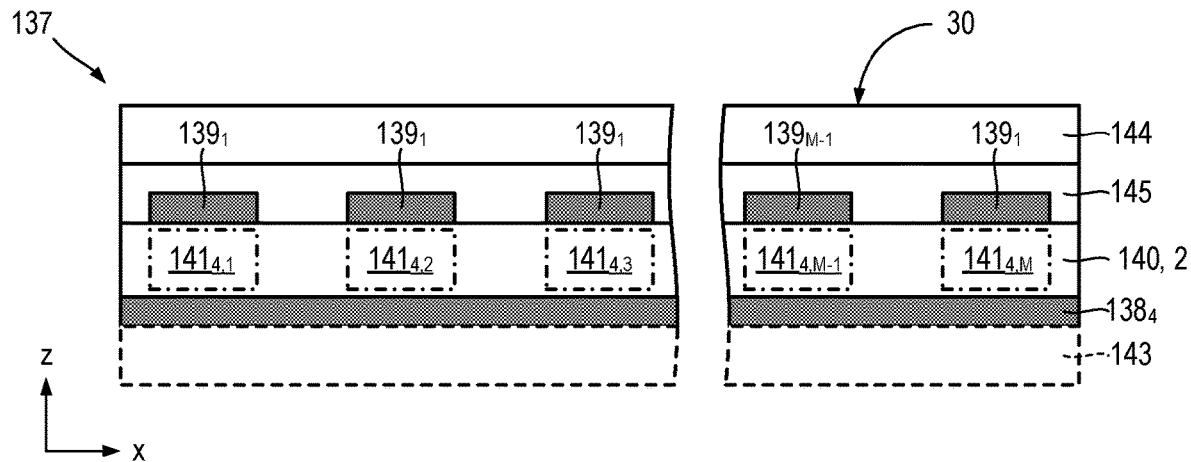
FIG. 24 is a schematic cross-section of a third photo-capacitance sensor.
Figure 25:
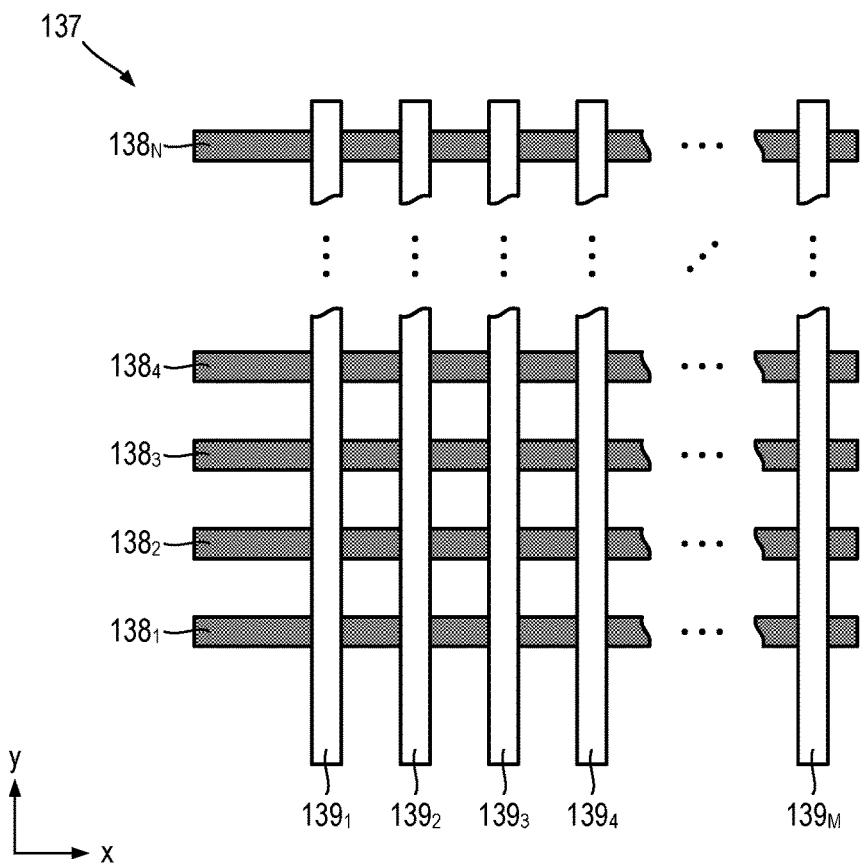
FIG. 25 is a schematic plan view of electrodes of the third photo-capacitance sensor.

For example, referring also to FIGS. 24 to 26, the structure and operation of an integrated touch and photo-capacitance sensor 137 (hereinafter the "third photo-capacitance sensor") is shown.

The third photo-capacitance sensor 137 is based on the understanding, as expressed hereinbefore, that a layer of photo-capacitive material 2 can be integrated as a passive dielectric layer in any existing capacitive touch panel.

The third photo-capacitance sensor 137 includes a number, e.g. N, of first electrodes $138_1$, $138_2$, ..., $138_N$ extending in a first direction x and spaced apart in a second, different direction y. The third photo-capacitive sensor 137 also includes a number, e.g. M, of second electrodes $139_1$, $139_2$, ..., $139_N$ extending in the second direction y and spaced apart in the first direction x. A layer 140 of photo-capacitive material 2 is disposed between the first 138 and second 139 electrodes such that each intersection of the first and second electrodes 138, 139 provides a photo-capacitor 141 of an array 36 of the third photo-capacitive sensor 137. For example, the intersection of an $n^{th}$ of N first electrodes $138_n$ with an $m^{th}$ of M second electrodes $139_m$ provides a photo-capacitor $141_{n,m}$ having capacitance $C_{n,m}$.

Figure 26:
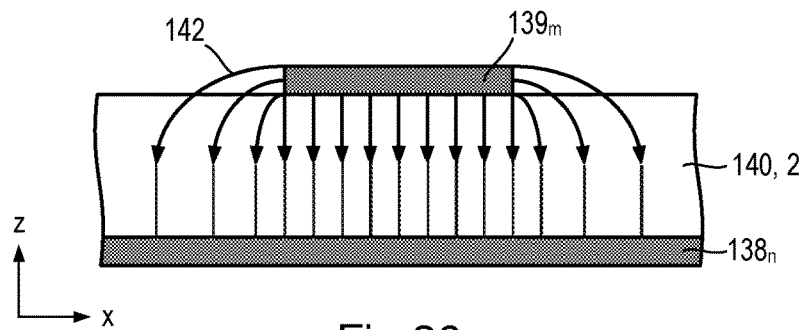
FIG. 26 schematically illustrates electric field lines between electrodes of the third photo-capacitance sensor.

Referring in particular to FIG. 26, the layer 140 provides the dielectric of each photo-capacitor $140_{n,m}$. When the photo-capacitive material 2 forming the layer 140 is illuminated, the dielectric constant changes, modifying a distribution of electric field lines 142 between the first and second electrodes $138_n$, $139_m$. In this way, the capacitances $C_{n,m}$ may couple geometrically to nearby conductive objects (in the usual way for projected capacitive touch), which also registering illumination through a photo-capacitive component of the response.

Any number of additional dielectric layers (not shown) may be inserted between the layer 140 and the first electrodes 138 and/or any number of additional dielectric layers (not shown) may be inserted between the layer 140 and the second electrodes 139.

The layer 140 of photo-capacitive material 2 does not need to be disposed between the first and second electrodes 138, 139.

Figure 27:
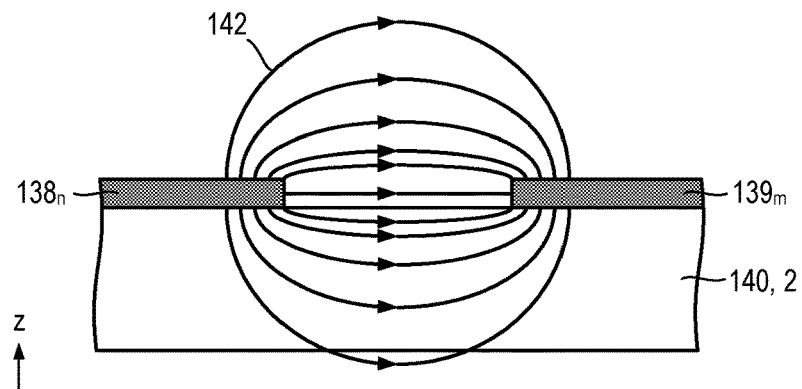
FIG. 27 schematically illustrates electric field lines between electrodes of a modification of the third photo-capacitance sensor.

For example, referring also to FIG. 27, in an alternative configuration the first electrodes 138 and the second electrodes 139 may instead be substantially co-planar/disposed on the same surface. Such configurations of co-planar (or substantially co-planar) electrodes are known in the field of capacitive touch, using e.g., local patches of insulator where electrodes 138, 139 cross, and measuring capacitances associated with fringing fields between electrodes 138, 139 rather than at areas of overlap (which are minimised). For example, diamond patterned electrodes for mutual capacitive touch sensing.

The first and second electrodes 138, 139 are disposed on, or over, the layer 140 of photo-capacitive material 2, such that each intersection of the first and second electrodes provides a photo-capacitor of the array. As illustrated by the field lines 142 as drawn in FIG. 27, an underlying layer 140 of photo-capacitive material 2 will still interact with, and modify, a capacitance between co-planar electrodes.

Any number of additional dielectric layers (not shown) may be inserted between the layer 140 and the first and electrodes 138, 139.

The third photo-capacitance sensor 137 may be disposed on (or integrated as part of), a display 143, for example an LCD, OLED or any other type of display. A cover 144, for example cover glass 55, may by bonded using or otherwise secured over the third photo-capacitance sensor 137 to protect the electrodes 138, 139 and provide the input surface 30. For example, the cover 144 may be bonded using optically clear adhesive 145 when the third photo-capacitance sensor 137 overlies (or forms a part of) the display 143.

The first and second electrodes 138, 139 are not limited to either being disposed either side of the layer 140 of photo-capacitive material 2 or being co-planer and disposed on, or over, the layer 140 of photo-capacitive material 2. In general, the relative position of the layer 140 relative to the first and second electrodes 138, 139 is limited only by the need to have electric field lines connecting the first and second electrodes pass via the photo-capacitive material 2. For example, in a further modification of the third photo-first and second electrodes 138, 139 may be separated by a non-photo-capacitive dielectric layer (not shown), and one, or a pair, of layers 140 of photo-capacitive material 2 may be disposed above and/or below the first and second electrodes 138, 139. In other words, layers may be stacked in the sequence: the layer 140 of photo-capacitive material 2, first electrodes 138, a non-photo-capacitive dielectric layer (not shown), second electrodes 139, and optionally a second layer 140 of photo-capacitive material 2.

In an alternative modification, the first and second electrodes 138, 139 may be substantially co-planar and supported on a substrate, with the layer 140 of photo-capacitive material 2 substantially co-planar with the first and second electrodes 138, 139, and patterned to fill the spaces between electrodes 138, 139.

Referring also to FIGS. 28 to 30B, a method of using the combined readout configuration 135 shall be described.

Firstly, the controller 136 scans the third photo-capacitance sensor 137 in a conventional projected capacitance mode, for example a first frequency (or a first set of frequencies). In the projected capacitance mode, fewer than all N first electrodes 138 and/or all M second electrodes 139 may be scanned. This is because the pitch of electrodes 138, 139 for e.g. fingerprint sensing is of the order of 50 microns, whereas conventional projected capacitive touch may use a pitch of the order of 5 mm.

Thus, the controller 136 may measure capacitances for at least a subset of the array 36 of photo-capacitors 32, 91, 141. Alternatively, several first electrodes 138 may be grouped together and/or or several second electrodes 139 may be grouped together for the purposes of projected capacitive sensing. In some examples, all electrodes 138, 139 may be used for projected capacitance sensing.

Figure 28:
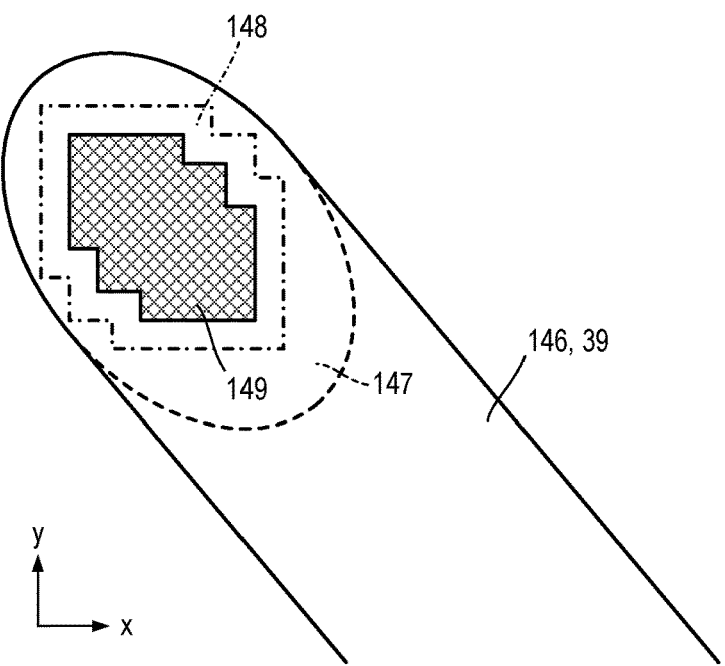
FIG. 28 schematically illustrates an interaction region, a dark region and a measurement region for the combined readout configuration shown in FIG. 23.

When a user interaction is detected, for example that a digit 146 is pressed to the input surface 30, the controller 136 uses the projected capacitance data to determine an interaction region 147 (dashed line in FIG. 28).

Figure 29:
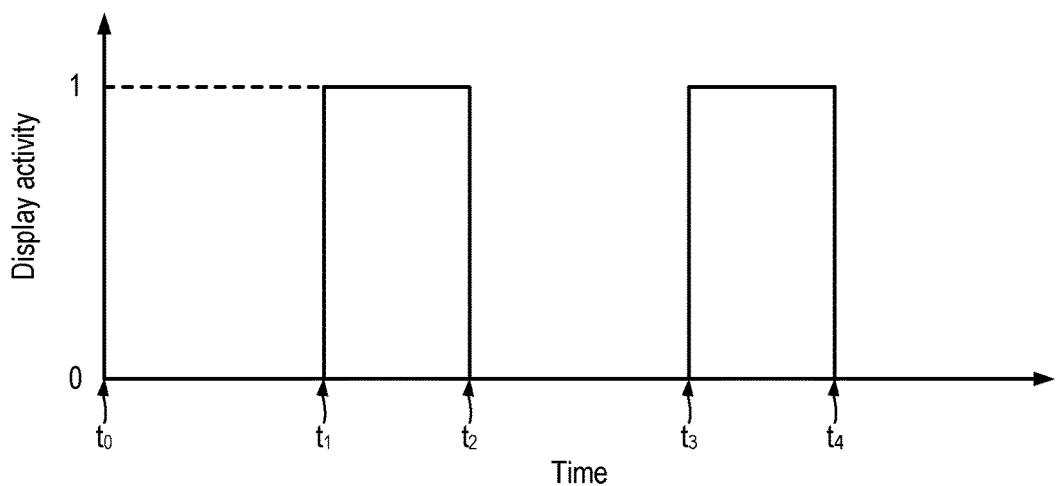
FIG. 29 schematically illustrates timings for the combined readout configuration shown in FIG. 23.

Within a dark region 148 (chained line) bounded by the interaction region 147 (which may be the entire interaction region 147), the controller 136 de-activates all light sources 31, including both light sources specifically used for photo-capacitance measurements and pixels of any underlying display 143. Referring in particular to FIG. 29, see e.g. times $t_0$ to $t_1$ and $t_2$ to $t_3$.

Figure 30A:
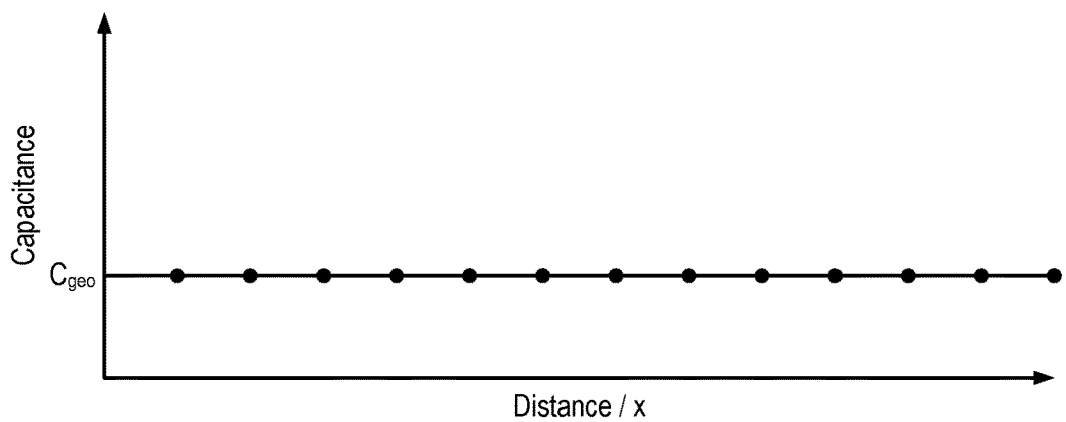
FIGS. 30A and 30B schematically illustrates measurements obtained during different periods shown in FIG. 29.

With no local illumination, the capacitance of each photo-capacitor is measured for each photo-capacitor 32, 47, 141 within a measurement region 149 of the dark region 148 (which may be the entire dark region 148). Referring in particular to FIG. 30A, this will provide a measure of the geometric capacitance components $C_{geo}$, absent any contribution from photo-capacitance resulting from light reflected from the input surface 30.

Figure 30B:
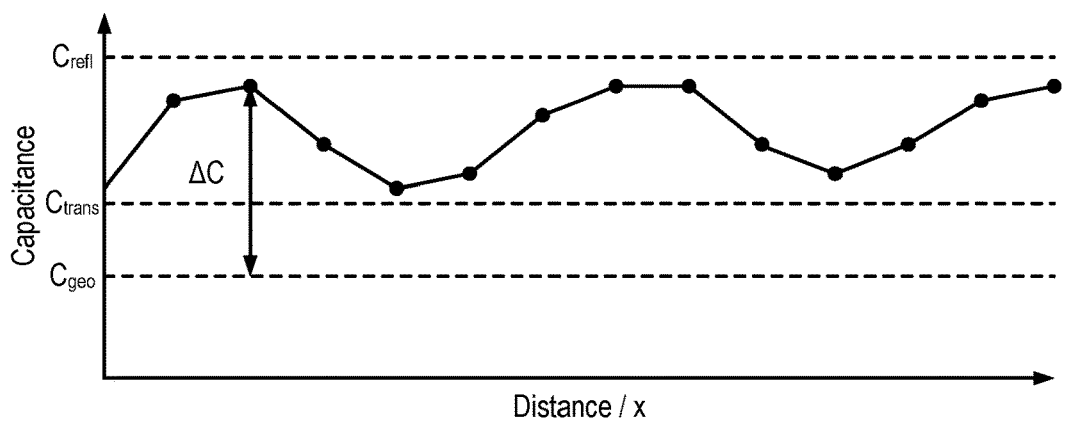

The controller 136 activates at least a subset of light sources 31 corresponding to the measurement region 149 (which may be equal to the dark region 148 and/or interaction region 147). The total capacitances $C_{total}$ are then measured for each photo-capacitor 32, 47, 141 within the measurement region 149. Referring in particular to FIG. 30B, each total capacitance $C_{total}$ will exhibit a change $\Delta C$ from the respective unilluminated (or dark) capacitance $C_{geo}$, with $\Delta C = C_{total} - C_{geo}$, and this change $\Delta C$ corresponds to the photo-capacitance signal. The changes $\Delta C$ will lie in a range between a value $C_{trans}$ corresponding to perfect transmission of light through the input surface 30 (i.e. light passes through layer 140 once) and another value $C_{refl}$ corresponding to perfect reflectance from the input surface 30 or an object one or just above it. The important point is that the measured changes $\Delta C$ may be used to measure a reflective pattern of an object 39.

The subset of light sources 31 may include all of the light sources 31 in the measurement region 149, or may be limited to all light sources 31 of a specific colour. For example, a display 143 may include red (R), green (G) and blue (B) pixels, and all may be de-activated to measure the projected capacitance components $C_{geo}$, followed by activating only the red (R) light sources for measurement of the total capacitances $C_{total}$. In some examples, different colours of light source 31 provided by a display 143, for example R, G and B, may be sequentially illuminated to obtain colour specific photo-capacitance measurements, enabling colour imaging of the object 39, for example a users' digit 146. In some examples, a display 143 may also include IR light sources (not shown) over at least an area, and only the IR light sources may be re-activated for the purposes of determining the photo-capacitive components $\Delta C$. Imaging colour, and in particular adding IR measurements, may allow detection of oxygenated human skin, in order to prevent spoofing using e.g. an image of a persons' fingerprint. Measurements may be extended across a sufficient period to detect a users' pulse, to provide additional security against spoofing.

The process of de-activating and activating light sources 31 may be repeated any number of times in order to refine the photo-capacitive components $\Delta C$, for example by averaging values measured during different periods ($t_1$ to $t_2$ and $t_3$ to $t_4$ for example). Referring in particular to FIG. 29, two cycles are shown, but any number of cycles may be used. When the light sources 31 include two or more colours, and two or more are used for measurements, these may be performed one after the other, or separated by a period of de-activating all light sources 31.

Addressing Schemes for the Combined Readout Configuration

The combined readout configuration 135 may be further understood by reference to some specific examples of addressing electrodes used for both projected capacitance touch sensing and photo-capacitance measurements.

Figure 31:
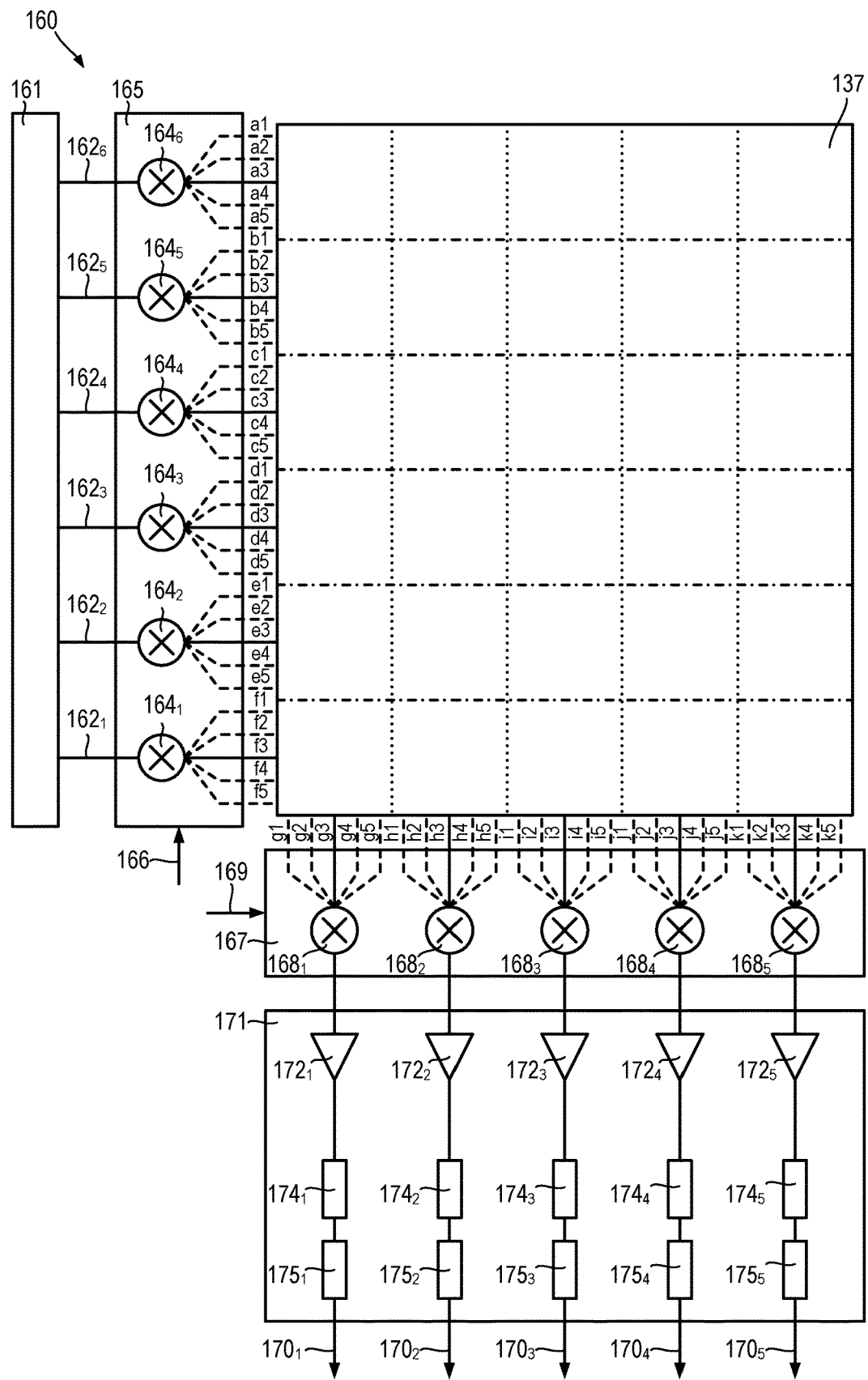
FIG. 31 schematically illustrates a first addressing scheme for implementing the combined readout configuration shown in FIG. 23.

Referring also to FIG. 31, a first addressing scheme 160 for the combined readout configuration 135 is shown.

The first addressing scheme 160 uses an example of the third photo-capacitance sensor 137, and utilises first and second electrodes 138, 139 for both projected capacitance touch detection and photo-capacitance measurements. The first addressing scheme 160 is a specific implementation of the combined readout configuration 135.

The first addressing scheme 160 includes a driving module 161 configured to output the driving signals 128, 130 to the photo-capacitance sensor 160. The driving module 161 is forms part of the controller 136, and has a number of transmitter outputs $162_1, \ldots, 162_6$ which is less than a number N of first electrodes 138 in the third photo-capacitance sensor 137. In the interests of following explanations, the first electrodes have been labelled a1 through f5 in FIG. 31. Each transmitter output 162 is connected to a group of two or more first electrodes 138, a1, ..., f5 via a respective multiplexer 164. For example, the first transmitter output $162_1$ is connected by multiplexer $164_1$ to first electrodes f1, f2, f3, f4, and f5. The multiplexers $164_1, \ldots, 164_6$ may be provided by (or form a part of) a transmitter switch network 165 (for example provided by, or forming part of, the controller 136).

The outputs from each multiplexer 164 are connected to a subset of first electrodes (for example, a1, a2, a3, a4) which are spatially grouped within the third photo-capacitive sensor 137. In other words, each transmitter output 162 may be multiplexed to first electrodes 138, a1, ..., f5 corresponding to a particular stripe or strip of the third photo-capacitance sensor 137. The stripes corresponding to different groups of first electrodes 138, a1, ..., f5 are indicated by horizontal chained lines in FIG. 31.

The outputs to which each transmitter output 162 is connected by the transmitter switch network 165 is governed by a first control signal 166 provided by a processor (not shown) of the controller 136. In general, the controller 136 may include one or more digital electronic processors (not shown), random access memory (not shown) and non-volatile storage (not shown), in addition to specific elements such as the driving module 161. The driving module 161, the transmitter switch network 164, and further components of the controller 136 described hereinafter, may be provided by hardware circuits, by a software module executed by the one or more processors of the controller 136, or by a combination of hardware and software.

The spacing of the first electrodes 138, a1, ..., f5 should be sufficiently fine to permit resolution of reflective patterns which it is desired to measure. For example, for fingerprint measurements, the pitch of the first electrodes 138, a1, ..., f5 may be of the order of 50 μm, and each transmitter channel 162 may be connected by the multiplexer 164 to in the region of 80 separate first electrodes 138, a1, ..., f5 (FIG. 31 only shows a 5-way split for visual clarity). By contrast, typical projected capacitance touch sensing panels may use an electrode pitch of several mm, for example 5 mm.

In order to reduce scan times, each transmitter output $162_1, \ldots, 162_6$ may be driven simultaneously, using frequency multiplexing of the driving signals 128, 130 to minimise cross-talk between groups of channels.

For projected capacitance sensing, it may be too time consuming and/or unnecessary to scan through all of the electrodes in each group (e.g. a1 through a5, or e1, through 35). Instead, a subset of the first electrodes 138, a1, ..., f5 may be driving for a projected capacitance mode. For example, only one first electrode 138 per transmitter channel 162 may be used, such as a3, b3, c3, d3, e3 and f3.

Alternatively, during projected capacitance sensing, two or more (or all) first electrodes 138 per group may be connected together (using switch network 166) for collective driving. For example, first electrodes b1, b2, b3, b4 and b5 may be connected together and driven as a single electrode in a projected capacitance sensing mode.

In response to the projected capacitance sensing mode detecting a user touch, the transmitter switch network 165 may be used to address and drive all first electrodes 138, a1, ..., f5 corresponding to the measurement region 149, for high resolution photo-capacitance measurements. For example, a users' finger may be detected at low resolution, followed up by a high resolution scan of the measurement region 149 to extract the users' fingerprint. This may be compared to stored data to decide whether or not to allow the user to unlock a phone, or to open a high security application (or "app") such as a banking app.

Additionally, in some examples, a second, projected capacitance scan may be conducted localised to the coarsely detected touch position, using a larger fraction of the first electrodes 138, a1, ..., f5 in order to obtain a refined estimate of the size and/or shape of the interaction area 147, prior to photo-capacitance scanning.

The second electrodes 139 are dimensioned similarly to the first electrodes 138, for example with the same pitch. For the purposes of the following discussion, the second electrodes 139 of the third photo-capacitive sensor 137 have been labelled g1 through k5 in FIG. 31.

On the receiving side, groups of second electrodes 139, g1, ..., k5 are connected to respective amplifiers 172 by respective multiplexers 168. For example, second electrodes g1, g2, g3, g4 and g5 are connected by multiplexer $168_1$ to a first amplifier $172_1$. The configuration is analogous to the transmitter side, and each group of second electrodes 139 (e.g. h1 to h5, j1 to j5 etc) corresponds to a strip or stripe of the third photo-capacitance sensor 137, indicated by vertical dotted lines in FIG. 31.

The multiplexers $168_1, \ldots, 168_5$ are provided by, or formed as part of, a receiver switch network 167. The receiver switch network 167 is a part of the controller 136 in the same way as the driving module 161 and/or the transmitter switch network 165. The connection pathways through the receiver switch network 167 are governed by a second control signal 169 provided by a processor (not shown) of the controller 136.

In an analogous manner to the addressing of the first electrodes 138, a1, ..., f5, for the projected capacitance sensing mode, it is not required to scan or monitor each of second electrodes 139, g1, ..., k5. Instead, a single second electrode 139 may be monitored per multiplexer 168, for example second electrodes 139 g3, h4, i3, j3 and k3 may be monitored for touch sensing by projected capacitance. Equally, two of more second electrodes 139, g1, ..., k5 may be connected together and monitored as a single electrode.

The outputs of each amplifier $171_1, \ldots, 171_5$ are passed through respective band pass filters $174_1, \ldots, 174_5$ and converted to the digital domain by analog-to-digital convertors (ADC) $175_1, \ldots, 175_5$. Each set of an amplifier 171, a filter 174 and an ADC constitutes a receiver channel of a front-end module 171. The front end module 171 is provided by, or formed as a part of, the controller 136 in the same way as the driving module 161, the transmitter switch network 165 and the receiver switch network 167. The receiver outputs $170_1, \ldots, 170_5$ are passed to a processor (not shown) of the controller 136 for determination of touch locations in projected capacitance mode, and reflectance patterns of an object 39 in a photo-capacitance mode.

In this way, conventional touch sensing using an existing projected capacitance touch controller may be combined with photo-capacitance measurements using the same touch controller, with minimal modification of the controlling electronics. Additionally, minimal modification of a touch sensor stack-up or structure is required, since the layer 140 of photo-capacitive material 2 may replace any existing dielectric layer of a capacitive touch sensor/touchscreen.

Whilst for biometric identification of a fingerprint, it is advantageous to scan only a measurement region 149 determined based on the projected capacitance measurements, there are some applications in which it may be useful to scan every photo-capacitance 141 in the array 36. For example, a phone or a tablet computer configured with the combined readout configuration 135 and the first addressing scheme 160 could be used to scan documents to a file.

Similarly, a user could use their device equipped and configured as described herein to scan a texture, material, fabric and so forth. The information obtained using photo-capacitive scanning could be sent to an online store to help the user to identify matching textures, materials, fabric and so forth they may wish to purchase.

Whilst FIG. 31 illustrates sub-division of first and second electrodes 138, 139 to a fine pitch across the entire area of the third projected capacitance sensor 137, in other examples a hybrid addressing scheme may be used. For example, only some transmitter outputs 162 may be multiplexed to fine resolution first electrodes 168 (and similarly for the second electrodes 169 and receiver channels), so that an area in which the fine resolution first and second electrodes 168, 169 intersect provides an area useable for high resolution photo-capacitance measurements (for example to measure a fingerprint for biometric identification), whilst reducing the overall numbers of electrodes and manufacturing complexity.

Although the first addressing scheme 160 has been illustrated using the third photo-capacitance sensor 137, the same or equivalent addressing schemes may be applied to the first or second photo-capacitance sensors 32, 47.

Figure 32:
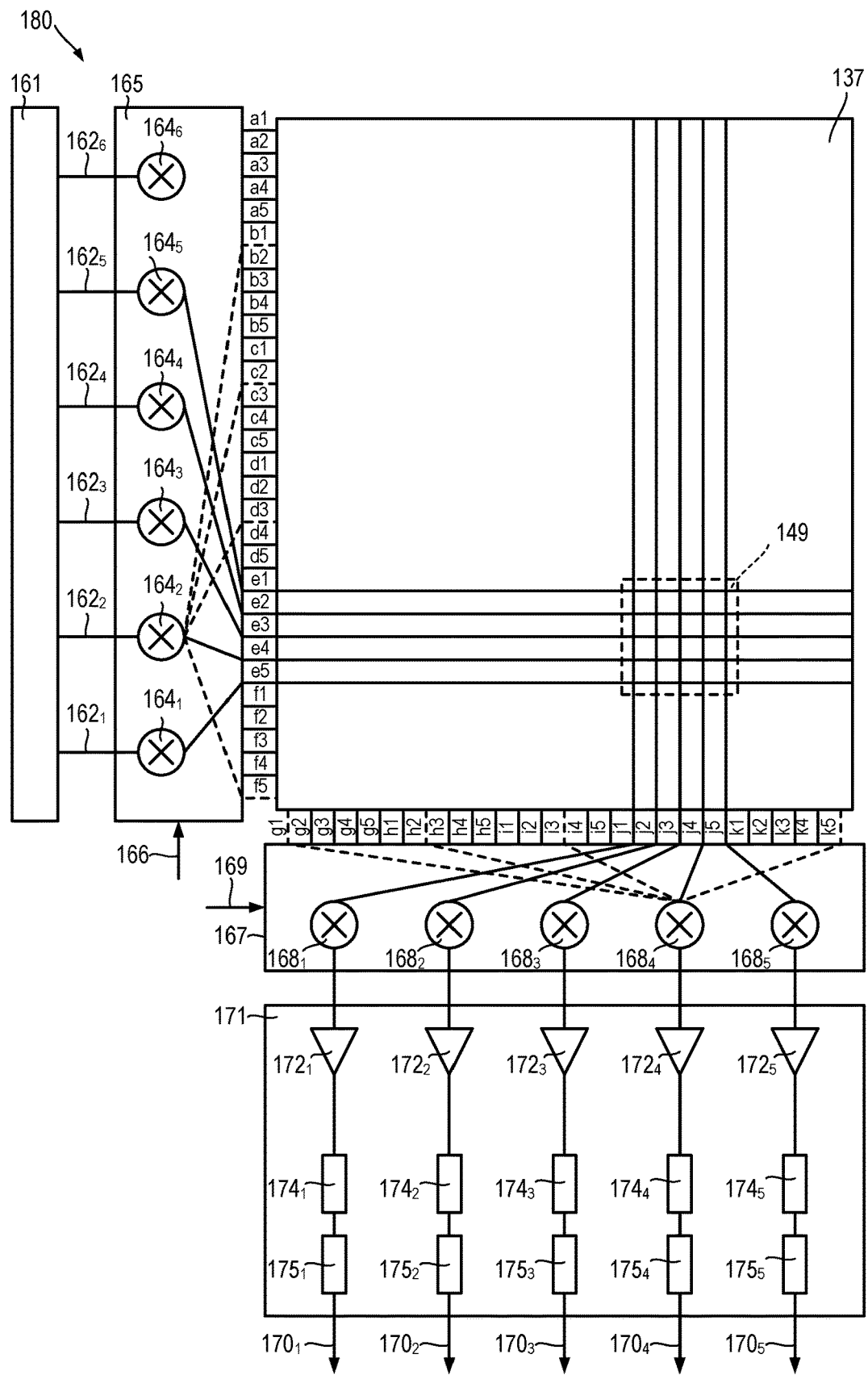
FIG. 32 schematically illustrates a second addressing scheme for implementing the combined readout configuration shown in FIG. 23.

Referring also to FIG. 32, a second addressing scheme 180 is shown.

The second addressing scheme 180 is identical to the first addressing scheme 160, except for the routing between transmitter channels 162 and first electrodes 138, a1, . . . , g5, and the routing between second electrodes 139, g1, . . . , k5 and receiver channels 172, 174, 175.

In particular, instead of being connected to a spatially grouped subset of first electrodes 138, a1, . . . , f5, the outputs of the multiplexers 164$_1$, . . . , 164$_6$ are interleaved such that within one or more spatially grouped subsets of first electrodes 138, a1, . . . , f5, each first electrode 138, a1, . . . , f5 in that group is connectable to a different transmitter output 162 via a respective multiplexor 164 For example, the outputs of multiplexer 164$_2$ in FIG. 32 are connected to first electrodes b1, c2, d3, e4 and f5. Meanwhile, the first electrodes e1, e2, e3, e4 and e5 corresponding to a measurement region 149 may be concurrently driven by respective transmitter outputs 162$_1$, 162$_2$, 162$_3$, 162$_4$ and 162$_5$ via the respective multiplexers 164$_1$, 164$_2$, 164$_3$, 164$_4$, 164, (using frequency multiplexed driving signals 130). The receiver switch network 167 is similarly configured.

This second addressing scheme 180 is more complex than the first addressing scheme 160, but may permit faster high resolution photo-capacitance scanning to measure, for example, a user fingerprint, because of the capacity to concurrently drive and/or monitor closely spaced electrodes 138, 139.

Hand/Palm Detection

Although methods have been described for locating a touch position using projected capacitance measurements, followed by high-resolution photo-capacitive scanning to obtain, for example, a fingerprint, the systems and methods of the present specification are not limited to a single touch and/or fingerprint at once.

Figure 33A:
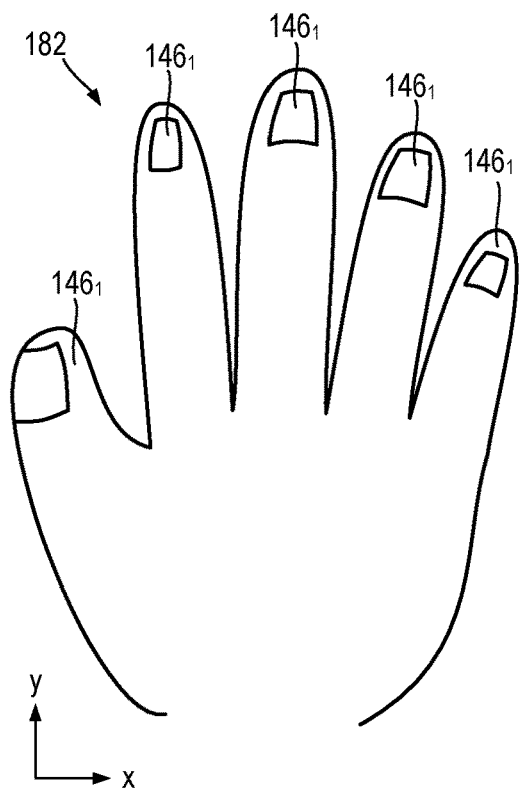
FIGS. 33A to 33D schematically illustrate whole hand/palm projected capacitance sensing, and corresponding measurement regions for photo-capacitance sensing.
Figure 33B:
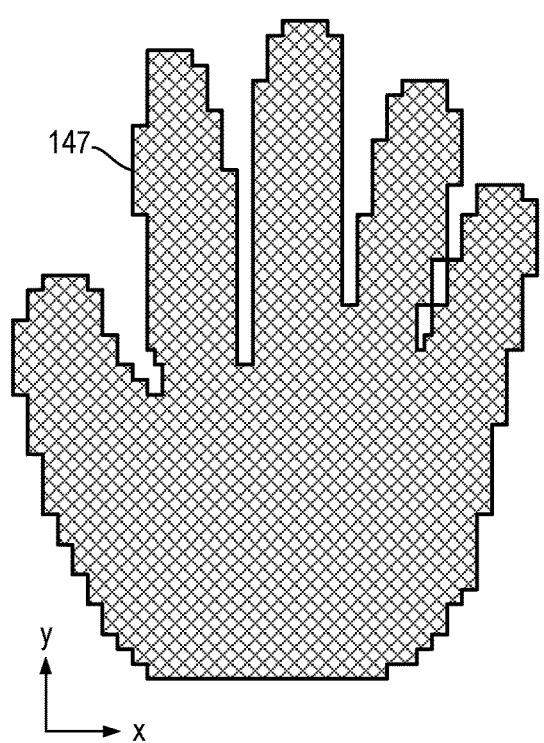
Figure 33C:
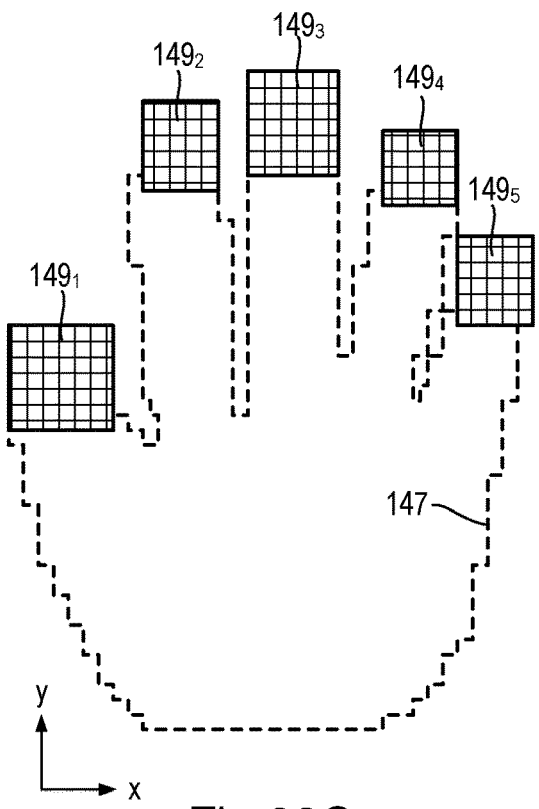

For example, referring also to FIGS. 33A to 33C, a whole hand/palm may be detected.

Referring in particular to FIG. 33a, a users' hand 182 has (typically) five digits 146$_1$, . . . , 146$_5$.

Referring in particular to FIG. 33B, if the entire hand is pressed to the input surface 30, then the corresponding interaction region 147 will correspond to the outline of the hand.

Apparatus in combining projected capacitance and photo-capacitance capabilities, for example using the. the separate readout configuration 124, the time-multiplexed readout configuration 132, or the combined readout configuration 135, may be further configured to analyse the shape and/or size one or more interaction regions 147 in order to determine suitable measurement regions 147 (and if appropriate dark regions 148).

Referring in particular to FIG. 33C, the apparatus 11 may determine whether the user interaction, i.e. the detected interaction region 147, corresponds to all or part of a user hand 182 in contact with the input surface 30, and in response to determining that detected interaction region 147 corresponds to all or part of a user hand, to determine one or more measurement regions 149 in the form of finger-print regions corresponding to the ends of digits 146$_1$, . . . , 146$_5$. In the example illustrated in FIG. 33C, the apparatus 11 identified the ends of each finger and the thumb, and assigns a corresponding measurement region 149$_1$, . . . , 149$_5$. The photo-capacitances corresponding to each measurement (finger-print) region 149$_1$, . . . , 149$_5$ may then be measured.

Other measurement regions 149 may also be defined, for example, the pattern of skin ridges on a users' palm may be added to fingerprint data for additional security.

Figure 33D:
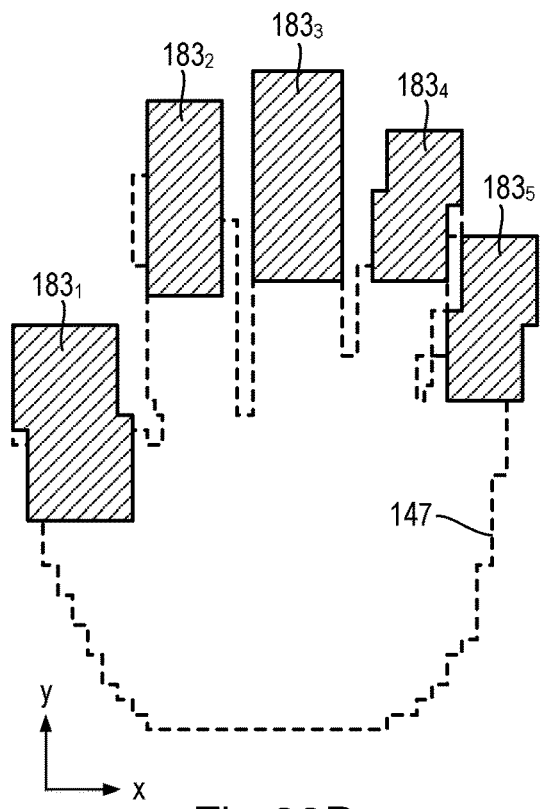

Different sizes and/or shapes of measurement region 149 may be defined for photo-capacitance imaging using different colours of light sources 31. For example, referring also to FIG. 33D, measurement regions 183$_1$, . . . , 183$_5$ may be defined for IR imaging (preferably near-IR, NIR) of sub-surface veins. Measurement regions 183$_1$, . . . , 183$_5$ for vein imaging may extend further along each digit 146$_1$, . . . , 146$_5$ than the respective measurement regions 149$_1$, . . . , 149$_5$ for fingerprints. Vein imaging may help to prevent spoofing, since the pattern of veins under a users' skin is also distinctive, and harder to spoof (fake using a replica etc). Scanning resolution may be lower for vein imaging than for fingerprint scanning to reduce scan time and power consumption.

For authentication purposes, it must be ensured that a sufficiently large area is measured, to avoid matching of similar regions of larger, distinct patterns.

Figure 34A:
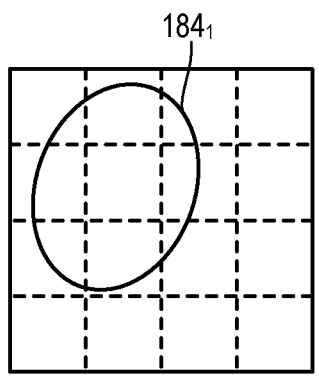
FIGS. 34A to 36B schematically illustrate relative areas corresponding to user touches having different applied forces.
Figure 34B:
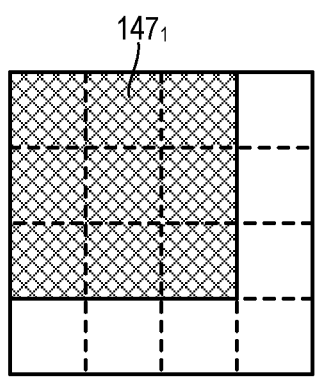

Referring also to FIG. 34A, a first contact region 184$_1$ of a users' digit 146 with the input surface 30 is illustrated, with the resolution of projected capacitance scanning visually indicated by dashed lines forming a grid. The corresponding first interaction region 147$_1$ is shown in FIG. 34B.

Figure 35A:
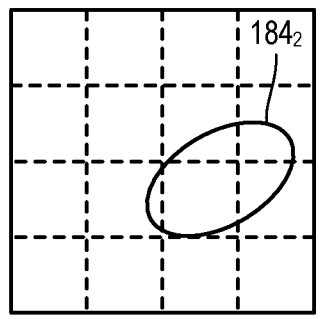
Figure 35B:
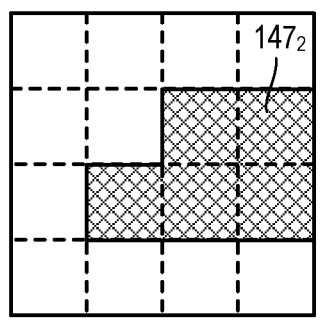

Referring also to FIG. 35A, a second contact region $184_2$ of a users' digit 146 with the input surface 30 is illustrated, with the corresponding second interaction region $147_2$ shown in FIG. 35B.

Figure 36A:
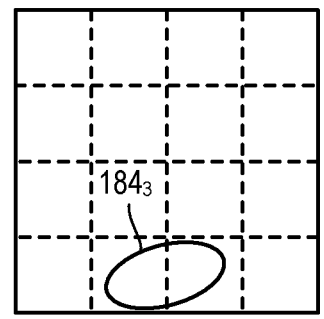
Figure 36B:
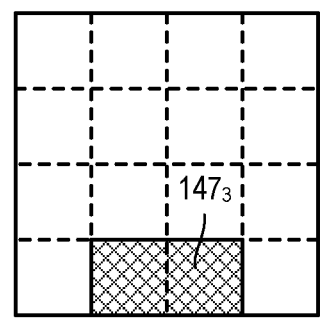

Referring also to FIG. 36A, a third contact region $184_3$ of a users' digit 146 with the input surface 30 is illustrated, with the corresponding third interaction region $147_3$ shown in FIG. 36B.

The different sizes of contact regions 184 relate to different pressures with which a user presses the digit 146 against the input surface 30. In general, the harder a digit is pressed 146, the larger the contact region 184 becomes and the more of the corresponding finger/thumb print will be in contact with, or sufficiently close to, the input surface 30 for photo-capacitive scanning.

The apparatus 11 will only measure the interaction regions $147_1$, $147_2$, $147_3$, and so needs to analyse the area (and optional shape) of the interaction regions $147_1$, $147_2$, $147_3$. Comparison of a pattern of photo-capacitances against a set of one or more authorised patterns 119 may be made conditional upon the interaction area 147 (and more specifically a corresponding measurement area if different) exceeding a minimum area. For example, it may be determined that the first and second interaction regions $147_1$, $147_2$ are large enough (e.g. exceed a threshold) that a meaningful fraction of a finger/thumb print may be obtained, however, the third interaction region may $147_3$ may be too small.

The size of an interaction area 147 may be determined based on projected capacitance measurements alone, or using a combination of projected capacitance measurement and photo-capacitance measurements.

When the apparatus 111 includes a display and the interaction area 147 is determined to be insufficient for a comparison, the display may be controlled to display a message informing a user to re-position their digit (or palm etc), and/or to press harder to allow a more complete measurement to be made.

Transmission Based Photo-Capacitance Sensing

Examples have been described which are configured to use photo-capacitors 32, 47, 141 to detect light from light sources 31 which is reflected from an object 39 contacting, or proximate (e.g. <1 mm) to an input surface.

However, the arrays 36 of photo-capacitors 32, 47, 141 and associated readout and addressing schemes described hereinbefore may be applied to other applications.

Figure 37:
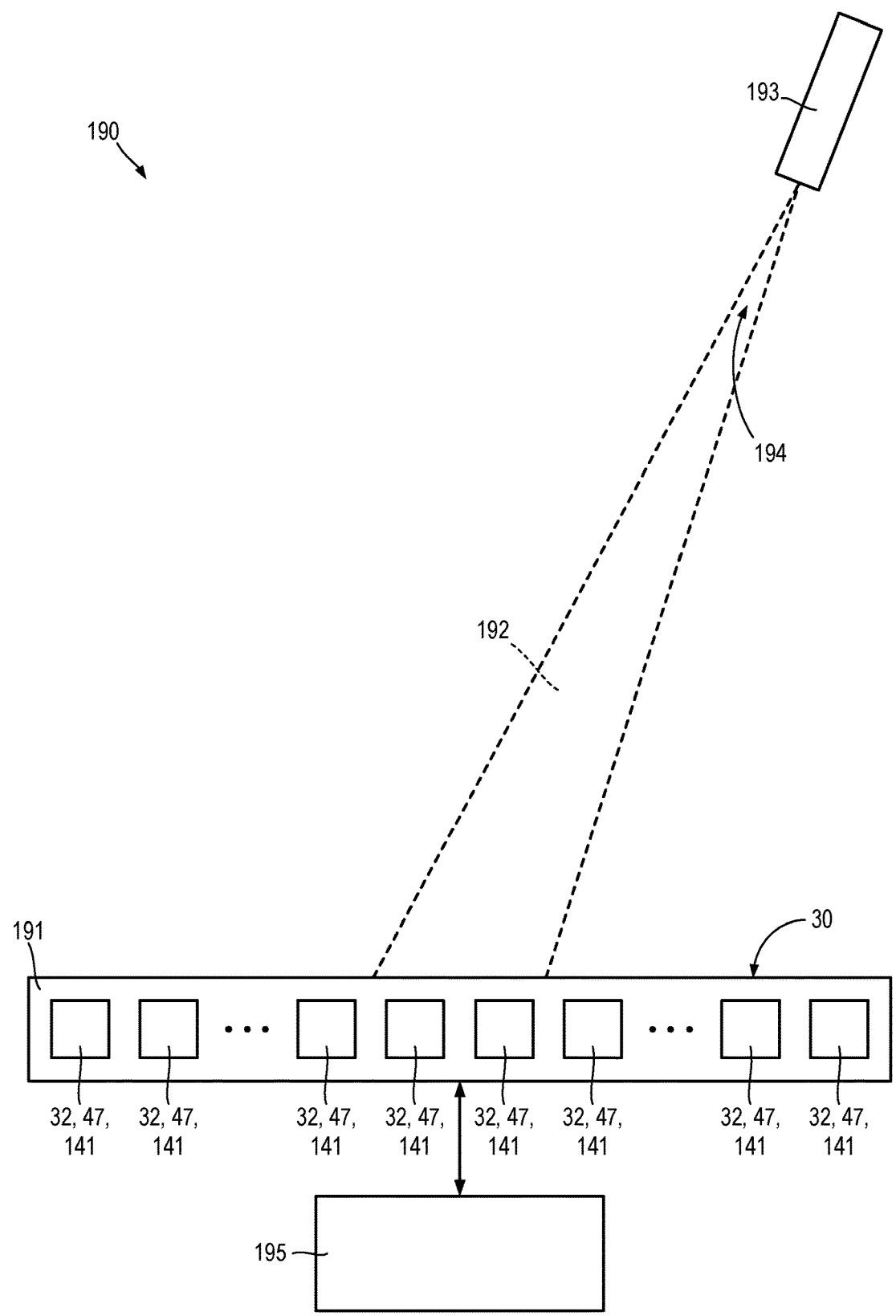
FIG. 37 schematically illustrates a presentation system including a fourth photo-capacitance sensor.

For example, referring also to FIG. 37 a presentation system 190 is shown.

The presentation system 190 includes a fourth photo-capacitance sensor 191 which includes, an input surface 30 and an array 36 of photo-capacitors 32, 47, 141 arranged to receive light 192 from a light source 193 which is transmitted through the input surface 30. The light source 193 is a highly collimated source, with a low angle of divergence 194, for example a laser pointer. The spacing between elements of array 36 of photo-capacitors 32, 47, 141 should configured for detecting a laser point spot, for example, between about 1 mm to 5 mm. The presentation system 190 also includes a controller 195 configured to monitor the photo-capacitances of the fourth photo-capacitance sensor 191.

The input surface 30 here may correspond to a large size display screen, a smart screen onto which a projector is directed, and similar systems for displaying content on a large scale to an audience. The addition of the fourth photo-capacitance sensor 191 may allow a presenter to interact with the displayed content using a laser pointer to provide a cursor similar in function to a mouse or track-ball.

Although claims have been formulated in this application to particular combinations of features, it should be understood that the scope of the disclosure of the present invention also includes any novel features or any novel combination of features disclosed herein either explicitly or implicitly or any generalization thereof, whether or not it relates to the same invention as presently claimed in any claim and whether or not it mitigates any or all of the same technical problems as does the present invention. The applicant hereby gives notice that new claims may be formulated to such features and/or combinations of such features during the prosecution of the present application or of any further application derived therefrom.

The invention claimed is:
1. An apparatus comprising:
a photo-capacitance sensor comprising:
an input surface;
one or more light sources arranged to illuminate a portion of the input surface;
an array of photo-capacitors arranged to receive light from the one or more light sources which is reflected from an object in contact with, or proximate to, the illuminated portion of the input surface;
wherein the array of photo-capacitors is configured for detecting a reflective pattern of the object;
a controller connected to the photo-capacitance sensor and configured to measure capacitances of the array of photo-capacitors, wherein the controller is further configured to measure photo-capacitive components of the capacitances of the array of photo-capacitors by:
measuring capacitances for at least a subset of the array of photo-capacitors;
determining an interaction region based on the capacitances of the subset of the array of photo-capacitors;
de-activating each light source corresponding to the interaction region;
measuring projected capacitance components for each photo-capacitor corresponding to the interaction region;
activating at least a subset of light sources corresponding to the interaction region;
measuring total capacitances for each photo-capacitor corresponding to the interaction region; and
determining photo-capacitive components corresponding to the interaction region based on differences of total capacitances and the respective projected capacitance components.

2. The apparatus according to claim 1, wherein the array of photo-capacitors is configured for detecting a fingerprint.

3. The apparatus according to claim 1, wherein the one or more light sources comprise one or more infrared emitters.

4. The apparatus according to claim 1, wherein the one or more light sources comprise one or more emitters selected from red, green and blue emitters.

5. The apparatus according to claim 1, wherein the array of photo-capacitors comprises:
a plurality of first electrodes extending in a first direction and spaced apart in a second, different direction;
a plurality of second electrodes extending in the second direction and spaced apart in the first direction;
a layer of photo-capacitive material disposed between the first and second electrodes such that each intersection of the first and second electrodes provides a photo-capacitor of the array.

6. The apparatus according to claim 1, wherein the array of photo-capacitors comprises:
a plurality of first electrodes extending in a first direction and spaced apart in a second, different direction;
a plurality of second electrodes extending in the second direction and spaced apart in the first direction;
wherein the plurality of first electrodes and the plurality of second electrodes are substantially co-planar, and are disposed on or over a layer of photo-capacitive material such that each intersection of the first and second electrodes provides a photo-capacitor of the array.

7. The apparatus according to claim 1, further comprising a display screen having a cover lens and a display stack-up, wherein the display stack comprises the photo-capacitance sensor, and wherein the cover lens provides the input surface.

8. The apparatus according to claim 7, wherein the display stack-up comprises conductive traces for projected capacitance touch sensing.

9. The apparatus according to claim 1, wherein the controller stores a reference frame corresponding to the measured capacitances of the array of photo-capacitors when the one or more light sources are illuminated in the absence of the object above or in contact with the input surface;
wherein the controller is further configured to subtract the reference frame from the capacitances measured from the array of photo-capacitances.

10. The apparatus according to claim 1, further configured such that in response to detecting a touch using projected capacitance, the controller measures capacitances of the array of photo-capacitors.

11. The apparatus according to claim 1, wherein the one or more light sources comprise one or more infrared light sources and one or more red light sources, wherein the controller is configured to:
illuminate the infrared light sources and measure a first set of capacitances from the array of photo-capacitors;
illuminate the red light sources and measure a second set of capacitances from the array of photo-capacitors;
and wherein the controller is configured to compare the first and second sets of capacitances to determine whether an object above or in contact with the input surface corresponds to human skin.

12. The apparatus according to claim 1, wherein the apparatus is configured:
to compare a pattern of capacitances measured using the array against a set of one or more authorised patterns;
in response to the pattern of capacitances measured using the array matches an authorised pattern of the one or more authorised patterns, to output a signal.

13. A method of using a photo-capacitance sensor comprising:
an input surface;
one or more light sources arranged to illuminate a portion of the input surface;
an array of photo-capacitors arranged to receive light from the one or more light sources which is reflected from an object in contact with, or proximate to, the illuminated portion of the input surface;
wherein the array of photo-capacitors is configured for detecting a reflective pattern of the object;
the method comprising using a controller connected to the photo-capacitance sensor to measure photo-capacitive components capacitances of the array of photo-capacitors by:
measuring capacitances for at least a subset of the array of photo-capacitors;
determining an interaction region based on the capacitances of the subset of the array of photo-capacitors;
de-activating each light source corresponding to the interaction region;
measuring projected capacitance components for each photo-capacitor corresponding to the interaction region;
activating at least a subset of light sources corresponding to the interaction region;
measuring total capacitances for each photo-capacitor corresponding to the interaction region; and
determining photo-capacitive components corresponding to the interaction region based on differences of total capacitances and the respective projected capacitance components.

14. An apparatus comprising:
a photo-capacitance sensor comprising:
an input surface;
one or more light sources arranged to illuminate a portion of the input surface;
an array of photo-capacitors arranged to receive light from the one or more light sources which is reflected from an object in contact with, or proximate to, the illuminated portion of the input surface;
wherein the array of photo-capacitors is configured for detecting a reflective pattern of the object;
a controller connected to the photo-capacitance sensor and configured to measure capacitances of the array of photo-capacitors;
the apparatus configured, in response to detecting a user interaction using projected capacitance measurements:
to determine whether the user interaction corresponds to all or part of a user hand in contact with the input surface;
in response to determining that the user interaction corresponds to all or part of a user hand, to determine one or more finger-print regions;
in response to determining one or more finger-print regions, to measure photo-capacitances corresponding to each finger-print region.

15. The apparatus according to claim 14, wherein the one or more light sources comprise one or more infrared emitters.

16. The apparatus according to claim 14, further comprising a display screen having a cover lens and a display stack-up, wherein the display stack comprises the photo-capacitance sensor, and wherein the cover lens provides the input surface.

17. The apparatus according to claim 16, wherein the display stack-up comprises conductive traces for projected capacitance touch sensing.

18. The apparatus according to claim 14, wherein the controller stores a reference frame corresponding to the measured capacitances of the array of photo-capacitors when the one or more light sources are illuminated in the absence of the object above or in contact with the input surface;
wherein the controller is further configured to subtract the reference frame from the capacitances measured from the array of photo-capacitances.

19. The apparatus according to claim 14, further configured such that in response to detecting a touch using projected capacitance, the controller measures capacitances of the array of photo-capacitors.

20. The apparatus according to claim 14, wherein the apparatus is configured:
- to compare a pattern of capacitances measured using the array against a set of one or more authorised patterns;
- in response to the pattern of capacitances measured using the array matches an authorised pattern of the one or more authorised patterns, to output a signal.

* * * * *